US012685079B2

(12) United States Patent
Hosek et al.

(10) Patent No.: US 12,685,079 B2
(45) Date of Patent: Jul. 14, 2026

(54) MODULAR MATERIAL HANDLING ROBOT PLATFORM

(71) Applicant: Persimmon Technologies Corporation, Wakefield, MA (US)

(72) Inventors: Martin Hosek, Lowell, MA (US); Sripati Sah, Wakefield, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 0 days.

(21) Appl. No.: 19/215,567

(22) Filed: May 22, 2025

(65) Prior Publication Data

US 2025/0285899 A1     Sep. 11, 2025

Related U.S. Application Data

(60) Continuation of application No. 18/432,192, filed on Feb. 5, 2024, now Pat. No. 12,341,043, which is a
(Continued)

(51) Int. Cl.
*H10P 72/30*          (2026.01)
*B25J 5/02*          (2006.01)
(Continued)

(52) U.S. Cl.
CPC ............ *H10P 72/3204* (2026.01); *B25J 5/02* (2013.01); *B25J 9/0009* (2013.01);
(Continued)

(58) Field of Classification Search
CPC ............. H10P 72/3204; H10P 72/3202; H10P 72/3302; H10P 72/0461; H10P 72/0464;
(Continued)

(56) References Cited

U.S. PATENT DOCUMENTS

| | | | |
|---|---|---|---|
| 5,878,952 A | 3/1999 | Powell | |
| 7,293,950 B2 | 11/2007 | Bonora et al. | |

(Continued)

FOREIGN PATENT DOCUMENTS

| | | | |
|---|---|---|---|
| CN | 15561535 A | 1/2005 | |
| CN | 106415813 A | 2/2017 | |

(Continued)

OTHER PUBLICATIONS

KR-20120137662-A English Translation (Year: 2012).*
(Continued)

*Primary Examiner* — Basil T. Jos
(74) *Attorney, Agent, or Firm* — McCarter & English, LLP

(57)          ABSTRACT

An apparatus including a first base plate, where the first base plate is configured to have at least one linear drive component and/or at least one power coupling component connected to a top side of the first base plate, where the first base plate is configured to be located inside a vacuum chamber; and a plurality of rails or transport guides on the top side of the first base plate. An end of the first base plate includes at least one alignment feature configured to align an end of the first base plate to an end of a second base plate. The first base plate is configured to provide, in combination with the second base plate, a structural platform inside the vacuum chamber for a robot drive to move in the vacuum chamber along the plurality of transport guides.

12 Claims, 41 Drawing Sheets

Related U.S. Application Data division of application No. 16/788,973, filed on Feb. 12, 2020, now Pat. No. 11,929,276.

(60) Provisional application No. 62/805,532, filed on Feb. 14, 2019.

(51) Int. Cl.

| | |
|---|---|
| *B25J 9/00* | (2006.01) |
| *B25J 9/12* | (2006.01) |
| *B25J 11/00* | (2006.01) |
| *B25J 19/00* | (2006.01) |

(52) U.S. Cl.
CPC ............ *B25J 19/0045* (2013.01); *B25J 9/123* (2013.01); *B25J 11/0095* (2013.01); *H10P 72/3202* (2026.01); *H10P 72/3302* (2026.01)

(58) Field of Classification Search
CPC ........ B25J 5/02; B25J 9/0009; B25J 19/0045; B25J 9/123; B25J 11/0095; B25J 21/005; B25J 11/00; B25J 19/00; B25J 21/00
See application file for complete search history.

(56) References Cited

U.S. PATENT DOCUMENTS

| | | | |
|---|---|---|---|
| 2005/0194096 A1 | 9/2005 | Price et al. | |
| 2012/0239184 A1 | 9/2012 | Cho et al. | |
| 2013/0071218 A1 | 3/2013 | Hosek et al. | |
| 2015/0214086 A1 | 7/2015 | Hofmeister et al. | |
| 2015/0318197 A1 | 11/2015 | Hiroki et al. | |
| 2016/0229296 A1 | 8/2016 | Hosek et al. | |
| 2017/0028546 A1 | 2/2017 | Wilkas et al. | |
| 2018/0143541 A1 | 5/2018 | Liu et al. | |

FOREIGN PATENT DOCUMENTS

| | | | | |
|---|---|---|---|---|
| CN | 107206916 A | | 9/2017 | |
| JP | 08110805 A | | 4/1996 | |
| JP | 2005116730 A | | 4/2005 | |
| JP | 2008028179 A | | 2/2008 | |
| JP | 2010037092 A | | 2/2010 | |
| JP | 4660434 B2 | | 3/2011 | |
| JP | 2011044970 A | | 3/2011 | |
| JP | 2018512032 A | | 4/2018 | |
| KR | 20120137662 A | * | 12/2012 | ............... B25J 5/02 |
| WO | 2012139476 A1 | | 10/2012 | |
| WO | 2013176025 A1 | | 11/2013 | |

OTHER PUBLICATIONS

Japanese Application No. 2024-182400, Office Action dated Jul. 17, 2025, 7 pages.
Japanese Application No. 2024-182400, JP Notice of Allowance dated Apr. 16, 2026, 3 pages.

* cited by examiner

LINEAR DRIVE SYSTEM — 30

POWER COUPLING SYSTEM — 62

DATA COMMUNICATIONS COUPLING SYSTEM — 64

HEAT TRANSFER COUPLING SYSTEM — 66

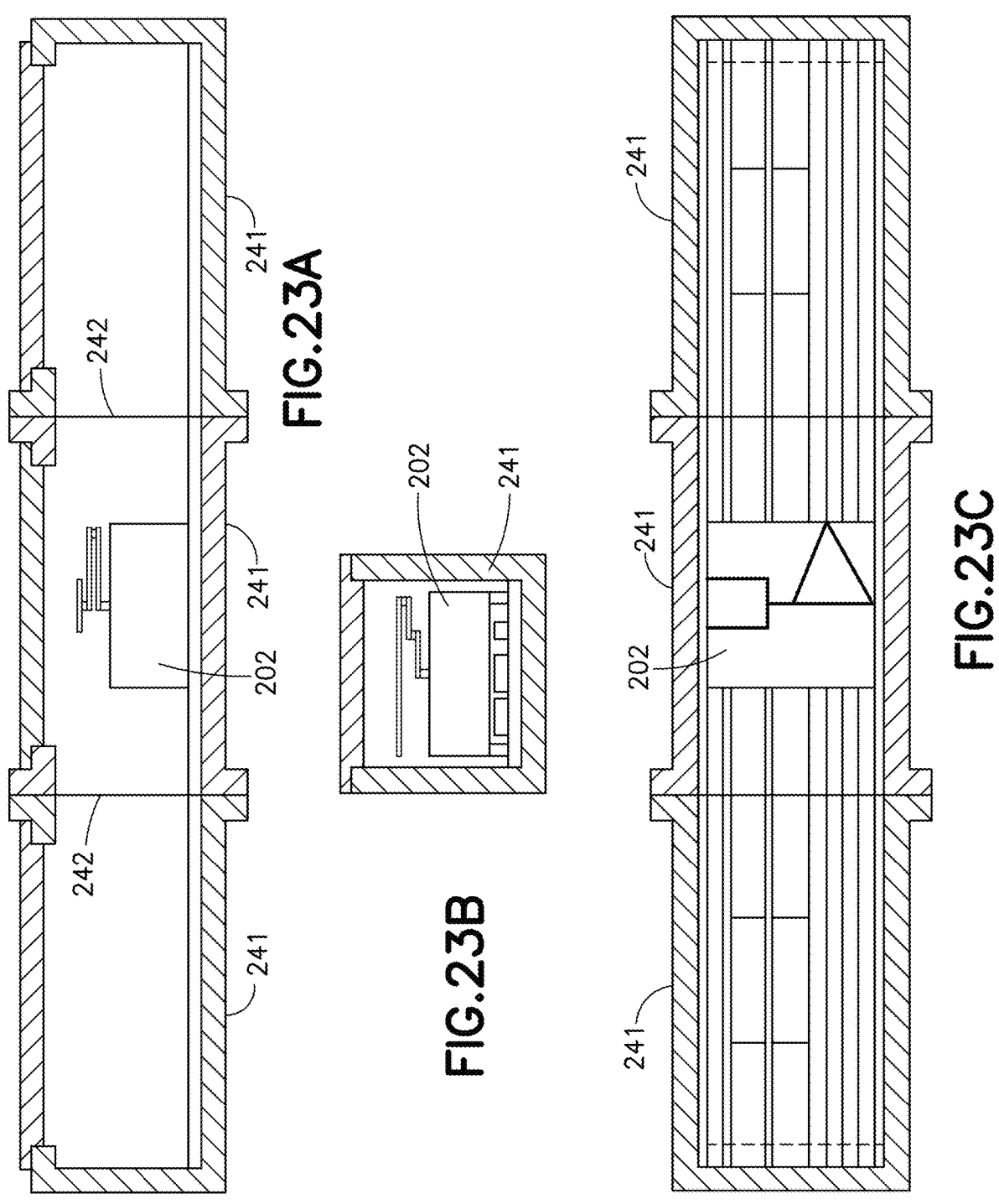

| FIG.25A | FIG.25B | FIG.25C |

| FIG.27A | FIG.27B | FIG.27C |

| FIG.28A | FIG.28B | FIG.28C |
|---------|---------|---------|

| FIG.29A | FIG.29B | FIG.29C |

| FIG.30A | FIG.30B | FIG.30C |

MODULAR MATERIAL HANDLING ROBOT PLATFORM

CROSS REFERENCE TO RELATED APPLICATION

This application is a continuation of U.S. patent application Ser. No. 18/432,192, filed Feb. 5, 2024, which is a divisional application of U.S. patent application Ser. No. 16/788,973, filed Feb. 12, 2020, and claims priority under 35 USC 119(e) to U.S. provisional application No. 62/805,532, filed Feb. 14, 2019, which are hereby incorporated by reference in their entireties.

BACKGROUND

Technical Field

The example and non-limiting embodiments relate generally to a substrate transport assembly.

Brief Description of Prior Developments

Robots for transporting substrates are known. Linear drive systems for transporting a substrate transport robot is also known such as described in U.S. patent publication numbers US 2016/0229296 A1, US 2013/0071218 A1, US 2015/0214086 A1, and US 2017/0028546 A1 which are hereby incorporated by reference in their entireties.

SUMMARY

The following summary is merely intended to be exemplary. The summary is not intended to limit the scope of the claims.

In accordance with one aspect, an example embodiment is provided in an apparatus comprising: a first base plate, where the first base plate is configured to have at least one linear drive component and/or at least one power coupling component connected to a top side of the first base plate, where the first base plate is configured to be located inside a vacuum chamber; and a plurality of rails on the top side of the first base plate, where an end of the first base plate comprises at least one alignment feature configured to align an end of the first base plate to an end of a second base plate, where the first base plate is configured to provide, in combination with the second base plate, a structural platform inside the vacuum chamber for a robot drive to move in the vacuum chamber along the plurality of rails.

In accordance with another aspect, an example method is provided comprising: connecting a first base plate assembly inside a vacuum chamber, where the first base plate assembly comprises a first base plate and a first plurality of rails on a top side of the first base plate; and connecting a second base plate assembly inside the vacuum chamber, where the second base plate assembly comprises a second base plate, where an end of the second base plate is connected to an end of the first base plate, where the first base plate assembly comprises at least one alignment feature configured to align the end of the first base plate to the end of the second base plate, where the first base plate is configured to provide, in combination with the second base plate, a structural platform inside the vacuum chamber for a robot drive to move in the vacuum chamber along the first plurality of rails.

In accordance with another aspect, an method is provided comprising: providing a base plate; providing a plurality of rails on a top side of the base plate; providing an end of the base plate with at least one alignment feature configured to align the end of the first base plate to an end of a second base plate; connecting to the top side of the base plate at least one of: a power coupling component configured to transfer power to another power coupling component on a robot drive, where the transfer of power is with induction, or a linear motor component configured to provide a magnetic field to move the robot drive along the plurality of rails, where the base plate is configured to be connected inside a vacuum chamber with the second base plate to provide a structural platform inside the vacuum chamber for the robot drive to move in the vacuum chamber along the first plurality of rails.

BRIEF DESCRIPTION OF THE DRAWINGS

The foregoing aspects and other features are explained in the following description, taken in connection with the accompanying drawings, wherein:

FIG. 23A is a schematic side view of a material-handling robot platform and cross section of a chamber comprising features as described herein;

FIG. 23B is an end cross sectional view of the platform shown in FIG. 23A;

FIG. 23C is a top cross sectional view of the platform shown in FIG. 23A-23B;

DETAILED DESCRIPTION OF EMBODIMENTS

Figure 1:
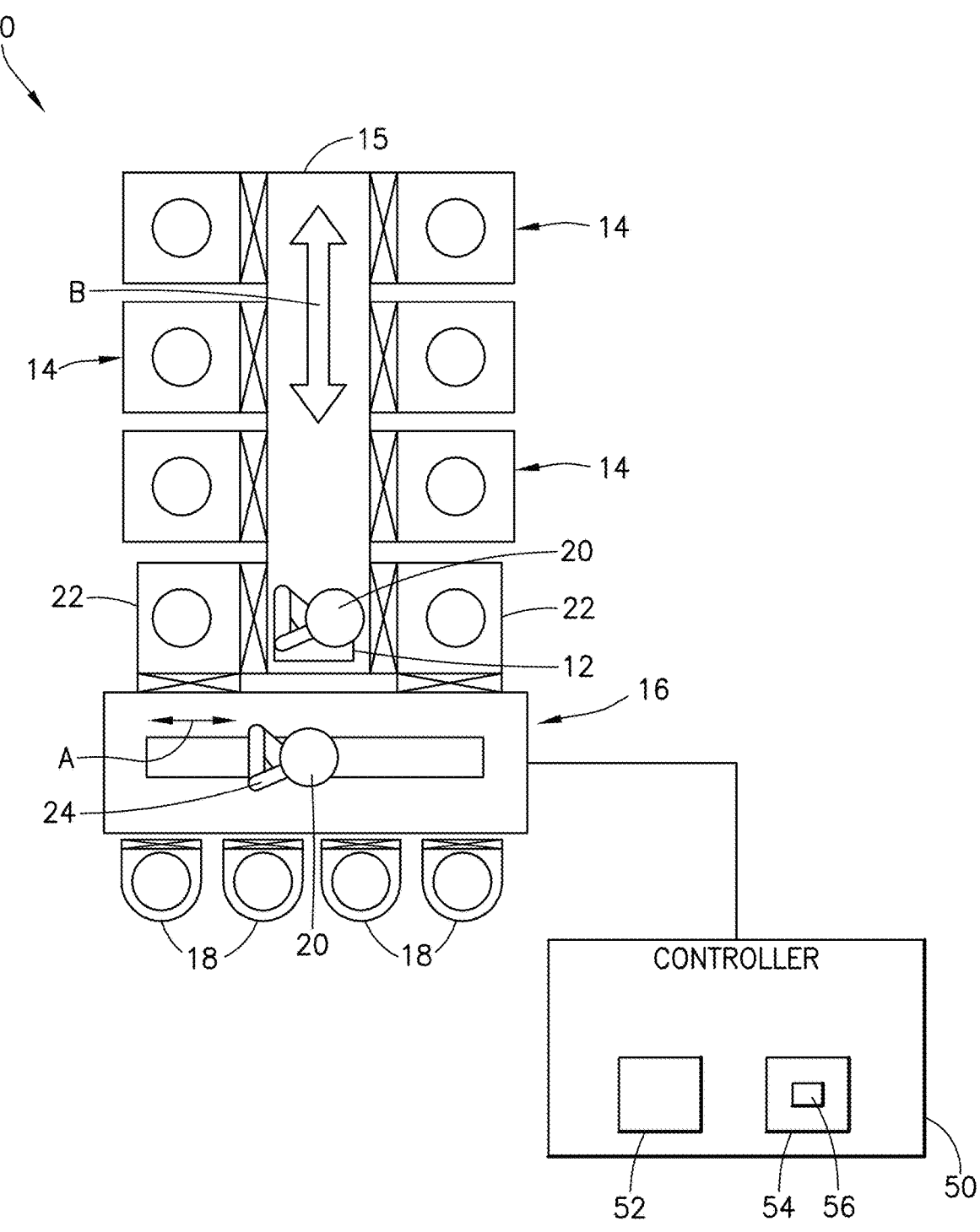
FIG. 1 is a schematic top view of a substrate processing apparatus comprising features as described herein.

Referring to FIG. 1, there is shown a schematic top plan view of an apparatus 10 incorporating features of an example embodiment. Although the features will be described with reference to the example embodiments shown in the drawings, it should be understood that features can be embodied in many alternate forms of embodiments. In addition, any suitable size, shape or type of elements or materials could be used.

The apparatus 10, in this example, is a substrate processing apparatus. The substrate processing apparatus 10 generally comprises a substrate transport apparatus 12 (also referred to as a linear vacuum robot), multiple substrate processing chambers 14, a transport chamber 15, an equipment front end module (EFEM) 16, and substrate cassette elevators 18. The transport chamber 15 may be maintained as a vacuum chamber or inert gas chamber for example. The transport apparatus 12 is located in the chamber 15 and is adapted to transport substrates 20, such as semiconductor wafers or flat panel displays for example, between and/or among the chambers 14, 15, and the stationing transfer chambers or load locks 22. The EFEM 16 is configured to transport the substrates 20 between the substrate cassette elevators 18 and stationing transfer chambers 22. In this example, the EFEM has a robot 24 having a scara arm. The robot 24 is configured to linearly move in the EFEM as indicated by arrow A. However, any suitable type of EFEM could be provided. The apparatus 10 includes a controller 50. The controller 50 comprises at least one processor 52 and at least one memory 54 comprising computer program code 56. The controller 50 is configured to control operations of the various devices and robots of the apparatus 10.

Figure 2:
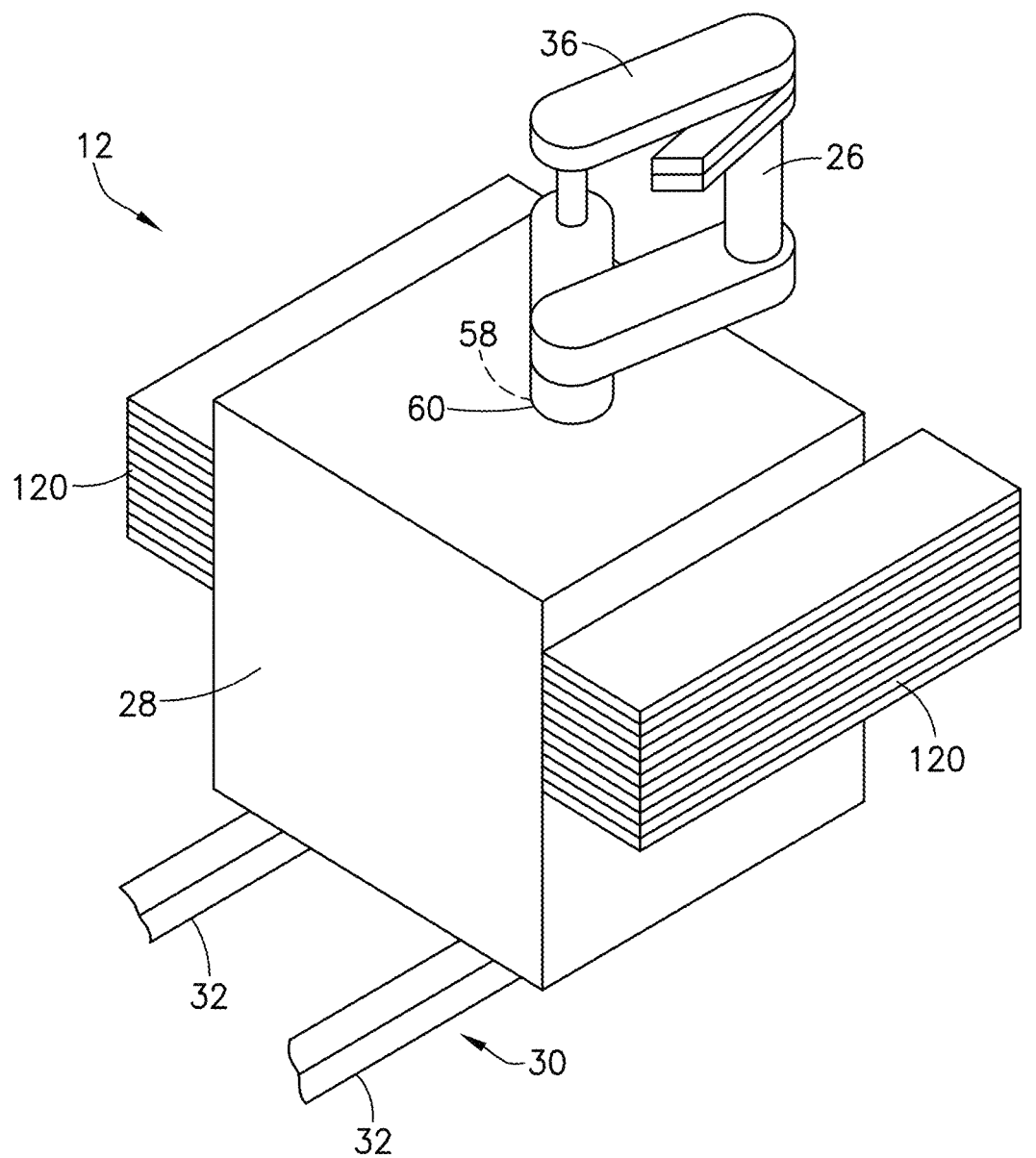
FIG. 2 is a perspective view of a substrate transport apparatus of the substrate processing apparatus shown in FIG. 1.
Figure 3:
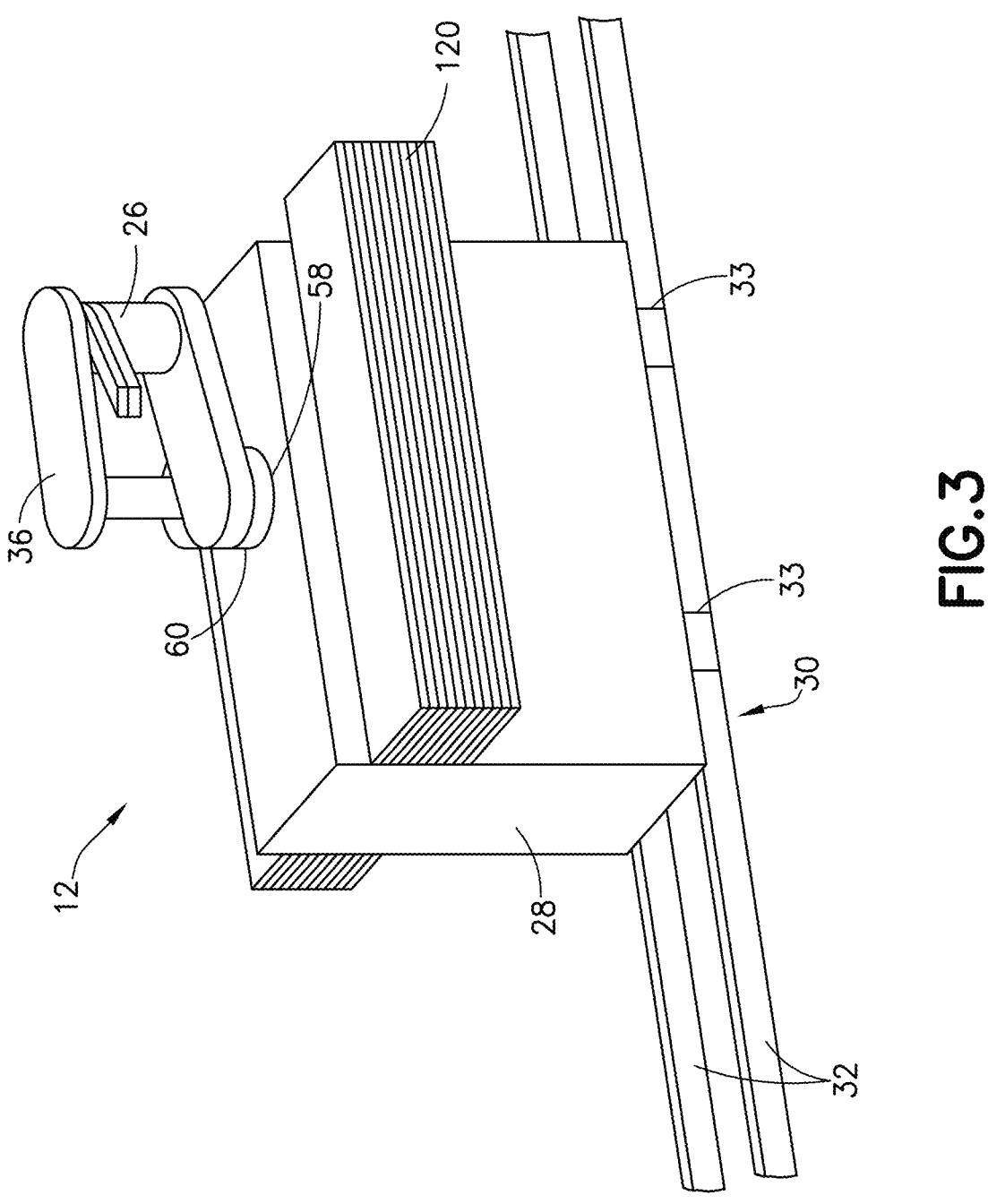
FIG. 3 is a perspective view of the substrate transport apparatus shown in FIG. 2.
Figure 4:
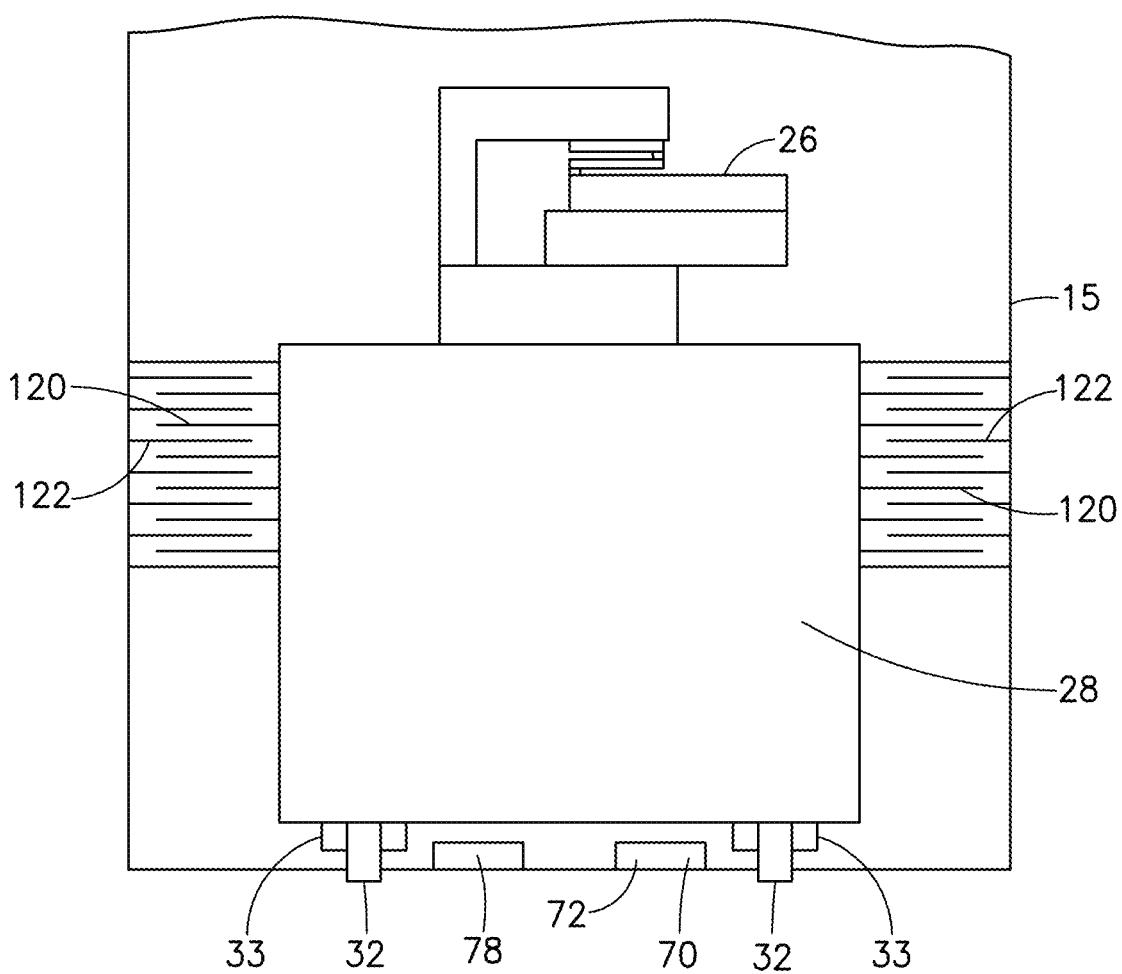
FIG. 4 is an end view of the perspective view of a substrate transport apparatus shown in FIGS. 2-3 shown inside a transport chamber of the substrate processing apparatus.

Referring also to FIGS. 2-4, perspective views and an end view of the substrate transport apparatus 12 are shown. In this example the substrate transport apparatus 12 comprises a robot 26, a robot enclosure 28, and a linear drive system 30. FIGS. 2-3 show the substrate transport apparatus 12 on the bottom wall of the transport chamber 15 with the side and top walls of the transport chamber 15 not shown. FIG. 4 shows the substrate transport apparatus 12 on the bottom wall or floor of the transport chamber 15 with merely the top wall of the transport chamber 15 not shown. The robot 26 is connected to the robot enclosure 28, and the robot enclosure 28 is movably relative to the chamber 15 by means of the linear drive system 30. The linear drive system 30 comprises guides 32 on the floor of the transport chamber 15 and trucks 33 on the exterior bottom side of the enclosure. For a maglev type of linear drive system, the trucks may be separated from the guides 32 by a spacing maintained by magnetism/electro-magnetism. For a non-maglev type of linear drive, the guides may comprise rails where the tucks ride on the rails. In an alternate example the guides may be maglev transport guides or tracks. In one example, the trucks 33 may have wheels attached to the bottom side of the enclosure which ride on the rails 32. The linear drive system 30 is configured to move the robot enclosure 28 and, thus, move the substrate transport apparatus 12, inside the transport chamber 15 along the rails 32 in a linear path as indicated by arrow B in FIG. 1. In alternate embodiments rather than an enclosure, the robot 26 may be attached to a non-enclosing slide or platform which has the trucks and rides on the rails/guides 32. In another alternate example, the guides and trucks could be provided at lateral side walls of the chamber 15 in addition to, or as an alternative, to the floor of the chamber 15.

Figure 5:
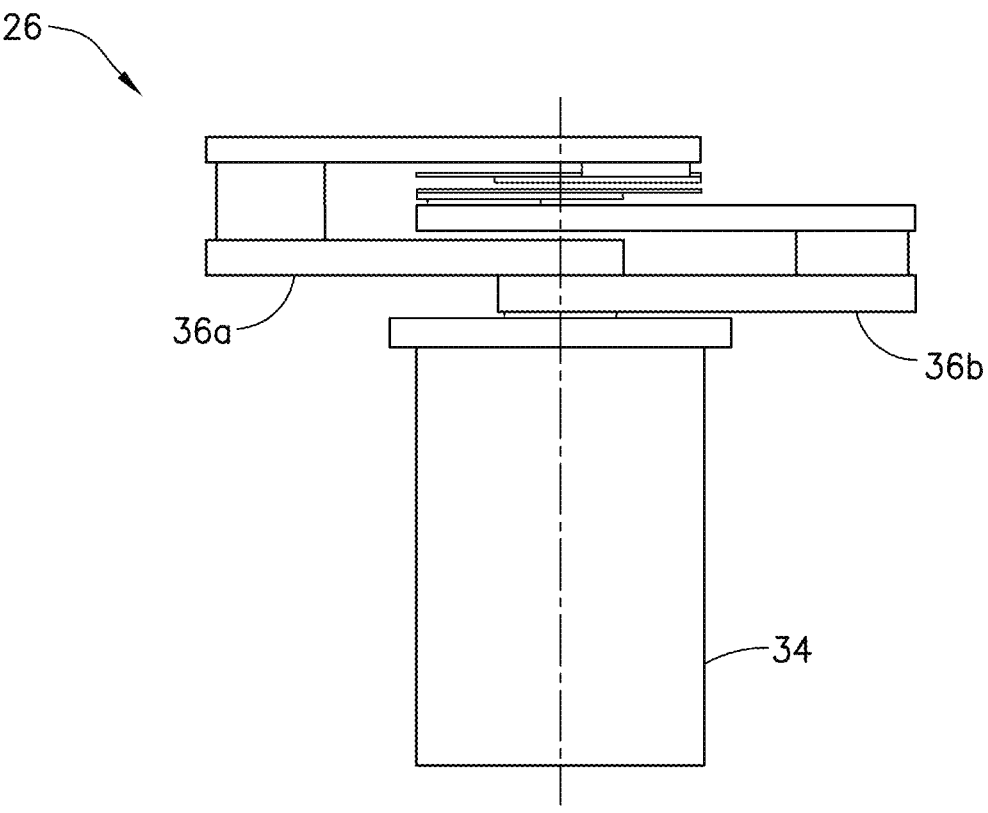
FIG. 5 is a side view of a robot of the substrate transport apparatus shown in FIGS. 1-4.
Figure 6:
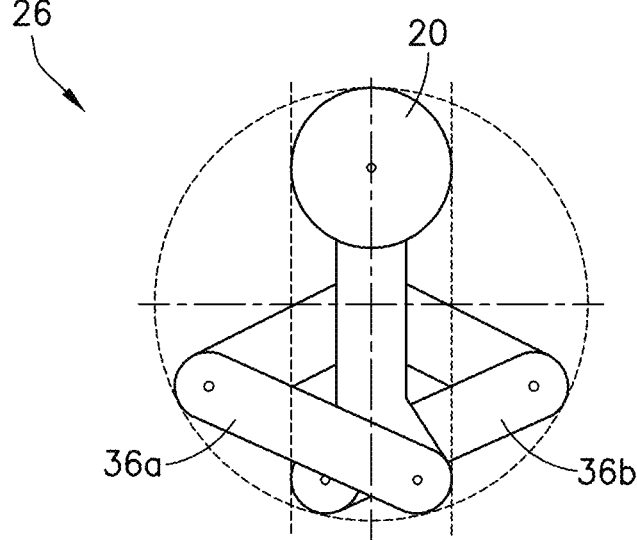
FIG. 6 is a top view of the robot shown in FIG. 5.
Figure 7:
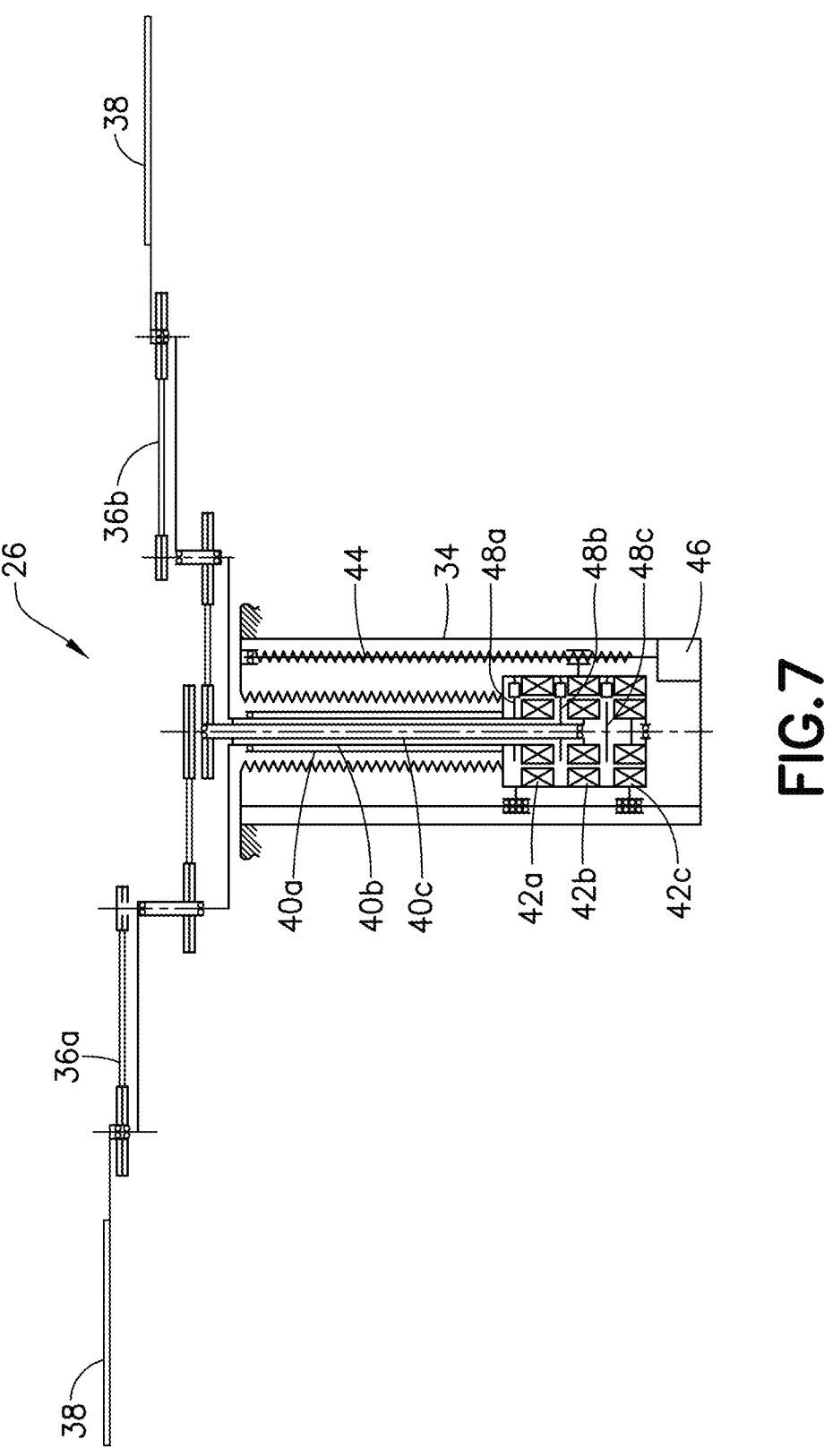
FIG. 7 is a schematic sectional view of the robot shown in FIGS. 5-6.

Referring also to FIGS. 5-7, the robot 26 generally comprises a robot drive 34 and a robot arm assembly 36 connected to the robot drive 34. The robot 26 shown in FIGS. 5-7 is merely one example of a robot having and effectors for moving substrates, and should not be considered as limiting. Any suitable type of robot, robot drive and robot arm could be provided. In this example the robot arm assembly 36 is a dual arm arrangement. Each of the arms 36a, 36b of the robot arm assembly 36 has arm links, pulleys, bands, and substrate support end effectors 38 which are driven by the coaxial drive shafts 40a, 40b, 40c of the robot drive 34. In an alternate example, the drive might include drive shafts which are not coaxially located relative to each other. The robot drive 34 has motors 42a, 42b, 42c for each drive shaft, a vertical drive system 44 including a motor 46, and various position encoders/sensors 48a, 48b, 48c for the motors 42 and/or drive shafts 40, and the vertical drive system 44.

The robot 26 is mounted to the robot enclosure 28 such that almost all of the robot 26 is located inside the robot enclosure 28 except for the robot arm assembly 36. This can be seen best in FIGS. 3-4 for example. In particular, the robot arm assembly 36 is located outside of the enclosure 28, proximate the top side of the robot enclosure 28, and the drive shafts 40a, 40b, 40c extend through an aperture 58 (see FIG. 3) in the top side of the robot enclosure 28 from the rest of the drive 34 located inside the enclosure 28. A seal 60 (see FIG. 3) is provided at the aperture 58 to seal the aperture 58, but still allow the drive shafts 40a, 40b, 40c to axially rotate and vertically move when moved by vertical drive system 44. With this type of embodiment, the area inside the enclosure 28 may have a different environment than the area inside the chamber 15. For example, the area inside the enclosure may merely be air at an atmospheric pressure, and the area inside the chamber 15 (outside of the enclosure 28) may be a vacuum environment or an inert gas environment.

Nested Environments

Figures 8, 9:
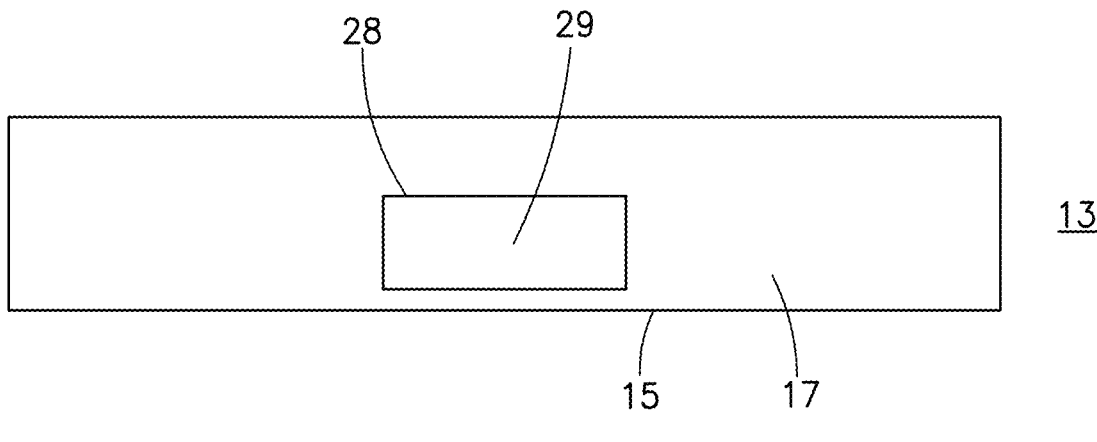
FIG. 8 is an end view of the substrate transport apparatus inside the transport chamber of the substrate processing apparatus.
FIG. 9 is a diagram illustrating various systems used with the apparatus shown in FIG. 1.

FIG. 8 illustrates schematically a "nested" type of arrangement which may be used in one example. The robot enclosure 28 may provide a hermetically sealed robot enclosure for the robot drive 34, except for the small portion of the drive shafts which extend through the aperture 58. More specifically, all of the motors 42, 44, all of the sensors 48, all of the electrical wiring, and most of the drive shafts 40 (see FIG. 7) are hermetically enclosed inside the robot enclosure 28. All of the active electrical hardware of the robot drive 34, including the sensors and motors, may be maintained inside the hermetically sealed robot enclosure 28 at area 29 shown in FIG. 8; separate from the environment outside the robot enclosure 28 in the area 17 of the transport chamber 15. The area 17 may be maintained as a separate environment inside the transport chamber 15 separate from the outside atmospheric environment 13. Thus, environment 29 is nested inside the environment 17, where the environment 17 separates the environment 29 from the outside atmospheric environment 13 (normal atmosphere 13 outside of the chamber 15). The environment 29 might be a vacuum environment, but does not need to be a vacuum environment even if the environment 17 is a vacuum environment. Because the environment 29 inside the robot enclosure 28 does not need to be a vacuum environment, this may help to prevent outgassing of vapors from components inside the robot enclosure 28. This nesting of environments (area 29 nested inside area 17) is particularly adapted to the robot enclosure 28 being movable inside the transport chamber 15 without breaching or being interrupted by the relative movement linearly along the length of the transport chamber 15.

Referring also to FIG. 9, in this example the apparatus 10 has the linear actuation system 30, a power coupling system 62, a data communications coupling system 64 and a heat transfer coupling system 66. The power coupling system 62 may be used to provide electrical power to components inside the enclosure 28. The data communications coupling system 64 may be used to send data signals to components inside the enclosure 28 (and/or through the enclosure to components in the arm) and/or to send data signals from the components inside the enclosure 28 to a data processor outside the chamber 15 (and/or through the enclosure from components in the arm). The heat transfer coupling system 66 may be used to transfer heat from components inside the enclosure 28 to outside the chamber 15. In an alternate example embodiment, the power coupling system 62 and the data communications coupling system 64 may be at least partially combined to reduce the number of components inside the area 17 of the chamber 15. In some embodiments, an apparatus may be provided which does not comprise all of the systems noted above.

In the example shown, all of these systems 30, 62, 64, 66 are configured to not breach or interfere with the nested environments shown in FIG. 8. In other words, the systems 30, 62, 64, 66 are suitable constructed such that the environment inside the enclosure 28 remains separated from the environment inside the chamber 15 while all four systems 30, 62, 64, 66 operate.

Linear Motor

Figure 10:
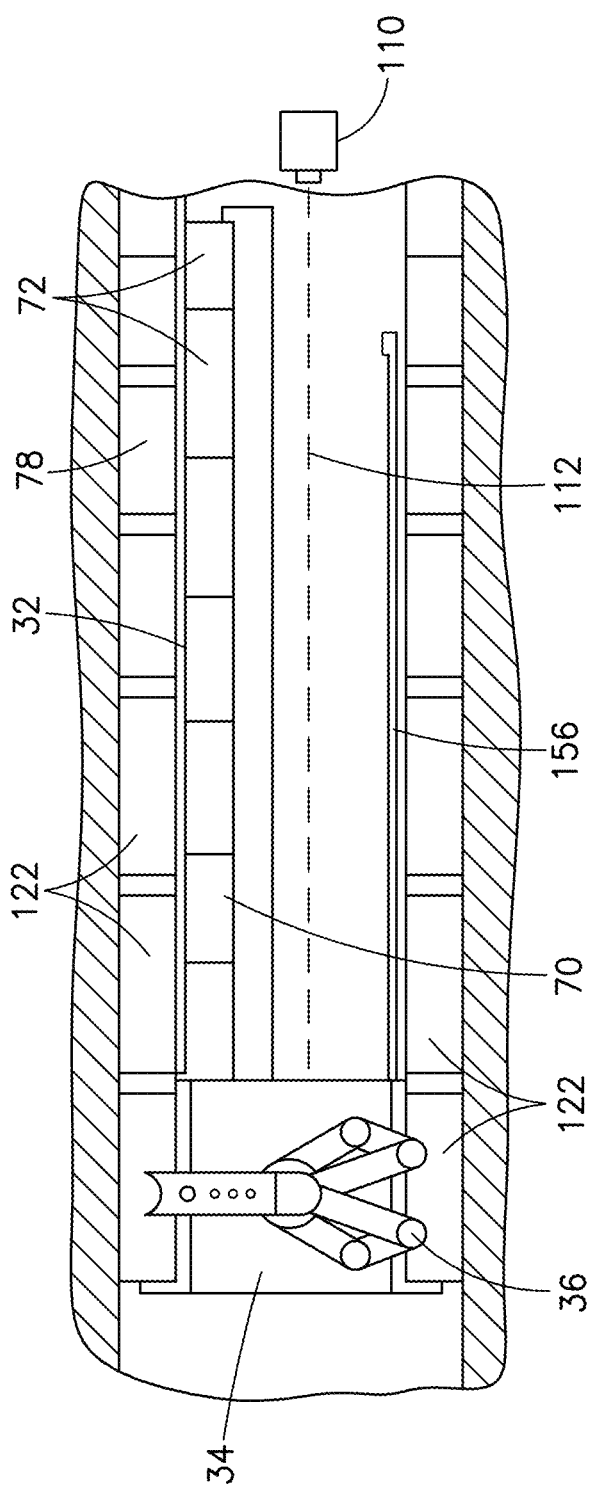
FIG. 10 is a schematic top view of the substrate transport apparatus inside the transport chamber of the substrate processing apparatus shown in FIG. 1.
Figure 11:
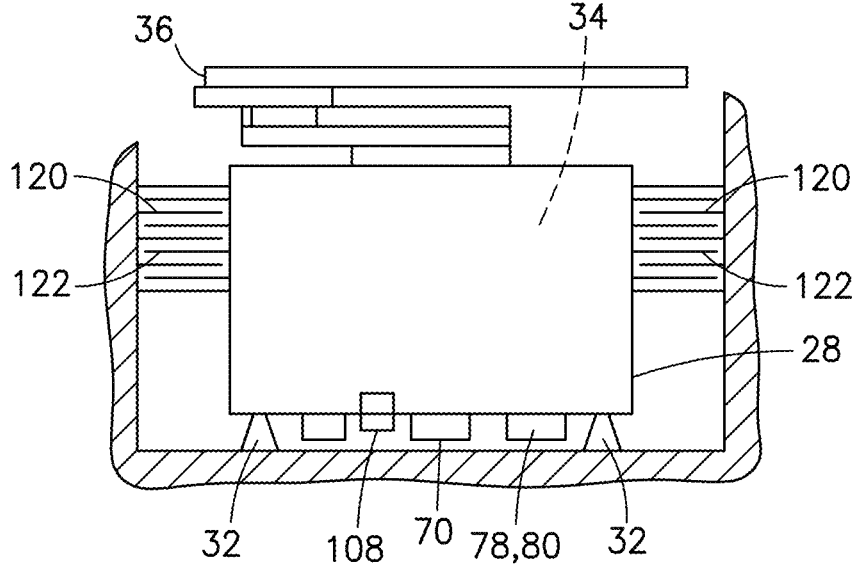
FIG. 11 is an end view of the substrate transport apparatus inside the transport chamber as shown in FIG. 10.

Referring also to FIGS. 10 and 11, the linear drive system 30 generally comprises a linear motor 70. A linear motor 70 is an electric motor that has had its stator and rotor essentially "unrolled" so that instead of producing a torque (rotation) it produces a linear force along its length. An example of this is disclosed in US patent publication No. US 2015/0214086 A1 which is hereby incorporated by reference in its entirety. The figures show the linear motor located under the enclosure 28. However, in alternate embodiments, one or more components of the linear drive might not be located under the enclosure 28. For example, components of the linear motor and/or the linear drive system 30 might be located at lateral sides of the enclosure 28 and chamber 15.

Figure 12:
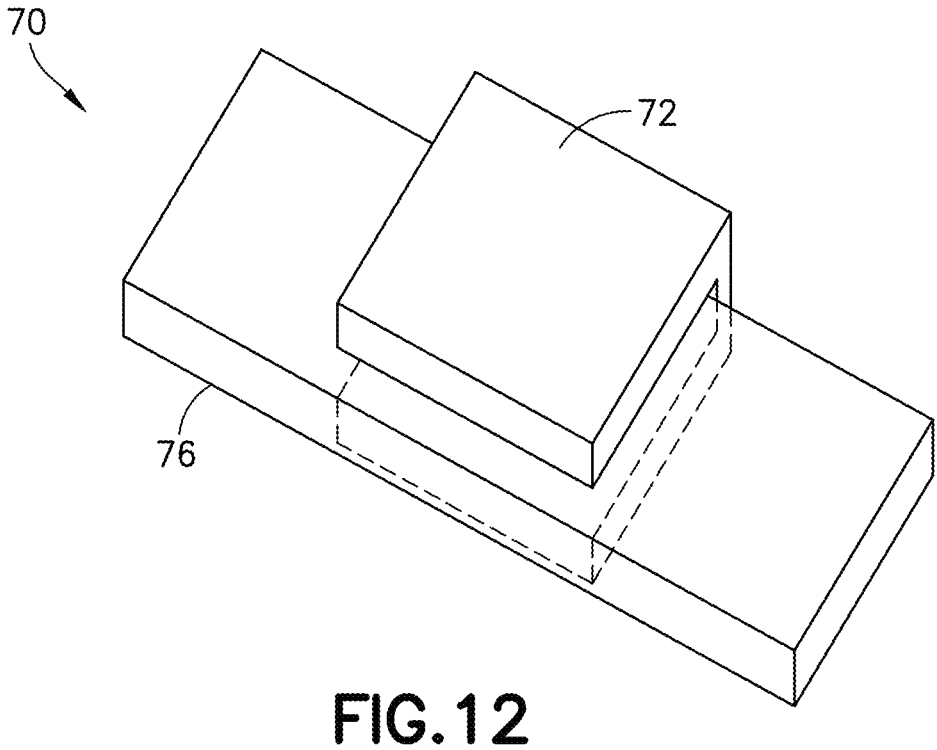
FIG. 12 is a perspective view showing one of the magnetic drivers and the driven member of the linear motor shown in FIGS. 10-11.
Figure 13:
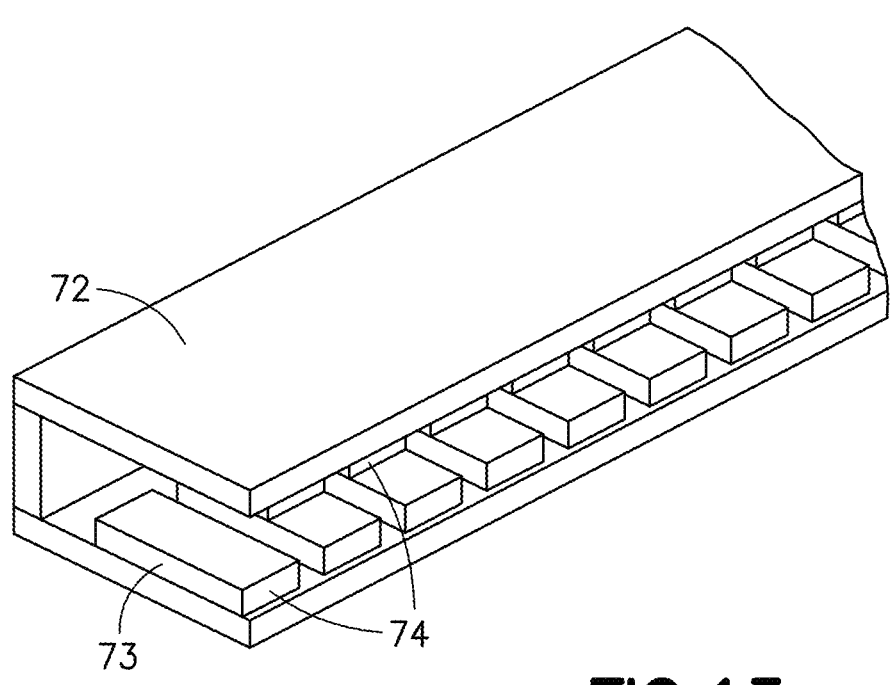
FIG. 13 is a perspective view of the magnetic driver shown in FIG. 12.

In one example embodiment the linear drive system 30 may comprise a maglev system utilizing a non-contact magnetically supported guidance subsystem. Referring also to FIGS. 12-13 the linear motor 70, in the example shown, utilizes a modular design comprising stationary magnetic drivers 72 and a driven member 76. The drivers 72 have a general "C" shape in this example. The general "C" shape forms a slot 73 with opposing electromagnets 74 on top and bottom sides of the slot 73. The drivers 72 are stationarily mounted to the bottom wall of chamber 15 in a row, as seen best in FIG. 10, and the driven member 76 is attached to the exterior of the bottom side of the robot enclosure 28. In an alternate example the drivers 72 might be attached to the robot enclosure 28 and the rail 76 might be stationarily attached to the transport chamber 15.

Figure 10A:
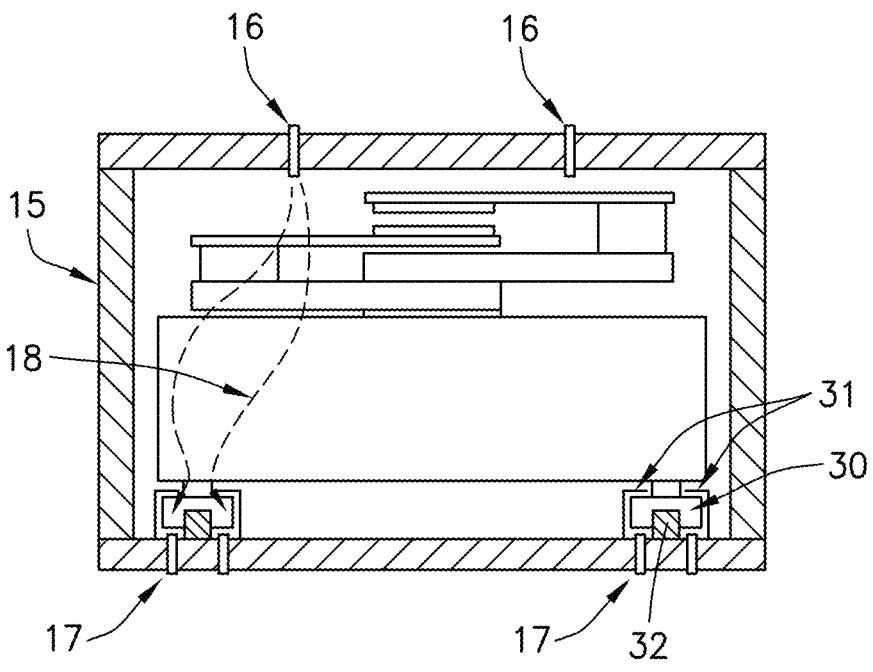
FIG. 10A is an end sectional view of the substrate transport apparatus inside the transport chamber of the substrate processing apparatus shown in FIG. 10.

Shielding may be provided around linear rails. Referring also to FIG. 10A, the transfer chamber 15 contains the robot with linear rails 32 and trucks 30, and the linear rails and trucks may be partially or completely enclosed in shields 31. The shield purpose is to reduce or eliminate migration of undesirable particulate or contaminant material from rails or trucks upward into the transfer chamber, while allowing robot motion in the direction of the rail. Further, the shield, which may be a single part or an assembly of parts, prevents migration of material, particulates, broken wafer fragments from the transfer chamber into the operation area of the linear rails. This helps prevent contamination/clogging of the linear rail mechanism.

The transfer chamber may also include vent ports 16 and pump ports 17, such that the vent ports are located substantially towards the top of the chamber 15 and the pump ports in the lower section or within the shielded area of shields 31. Such an arrangement further prevents migration of contaminants from within the shielded area into the transfer chamber. When the vent port is active, the molecules from the vent will travel towards the pump port, carrying with them any trace of airborne contaminants. Even when the vent port is closed, active pumping will still pull any contaminants away from the chamber and into the shielded region.

As shown best in FIG. 12, the driven member 76 extends into the slot of the "C" shaped drivers 72. Thus, the drivers

72 may utilize the same rail 76, extending from the bottom side of the robot enclosure 28, in an autonomous fashion. In alternate aspects, other guide rail arrangements, more or less may be provided and mounted in alternate arrangements, for example, on side walls of the chamber 15. As described above, the modular linear drive system may utilize a non-contact magnetically driven forcer subsystem. The subsystem may comprise one or more linear motor modules and one or more position feedback modules. With the use of the example described above, the enclosure 28 may be linearly moved inside the chamber 15, as indicated by arrow B in FIG. 1, without the need to pass any wires through the enclosure 28. The linear motor 70 is entirely outside the enclosure 28 and, thus, provision of the linear motor 70 does not increase a risk of a breach between the two areas 17, 29. Also, because driven member 76 does not contact any of the drivers 72, and driving of the driven member is merely magnetically controlled, there is less risk of contaminates from the driven member 76 and drivers 72 in the area 17. Supply of electrical power to the drivers 72 may be controlled by the controller 50 shown in FIG. 1. The drivers 72, or portions of the drivers 72, may be energized to create a magnetic field to move (such as accelerate and decelerate for example) the driven member 76 in linear directions B, and also magnetically positionally lock the enclosure 28 at fixed locations in front chambers 14 and 22 as needed.

Each linear motor module may have a stationary passive magnetic stainless steel part. The stationary passive magnetic stainless steel part may have a toothed portion that interacts with a corresponding primary forcer. The passive part may or may not also have magnets. Multiple supports may utilize the same secondary in an autonomous fashion. Each linear motor module may have a primary forcer coupled to supports where the primary forcer may have three phase windings and permanent magnets. In alternate aspects, permanent magnets may be provided as part of driven member for the purpose of offsetting gravity and dynamic loads. In alternate aspects, permanent magnets may be provided as part of one or more of the magnetic bearings for the purpose of offsetting gravity and dynamic loads. An example of a potential primary forcer and secondary topology is provided with the Siemens 1FN6 Design. In alternate aspects, any suitable forcer may be provided. The permanent magnets of the forcers may be provided as a component that both facilitates efficient generation of thrust (coupled with windings) and also offsets the payload such that the magnetic bearings minimize the use of power during normal operation. Here, the attractive force between the forcer and the corresponding passive rail may be set at a nominal gap such that the force offsets gravity-induced forces resulting in minimum power consumption. Further, the set point for the gap may be varied such that as the payload changes, the gap is adjusted such that the force offsets gravity induced forces resulting in minimum power consumption as the payload changes. For example, the gap on a left forcer may be varied independently of that of a right forcer. Voltage may be selectively applied by the advanced control subsystem to the magnetic coils of the primary forcer to produce thrust to the support relative to the stationary passive magnetic stainless steel secondary. Each stationary passive magnetic stainless steel secondary may be mounted with teeth oriented vertically down such that the attractive force of the primary forcer's permanent magnets may offset the weight of the support and the payload to minimize the DC component that needs to be applied by the vertical coils of the non-contact magnetically supported guidance subsystem.

Power Coupling System

Figure 14:
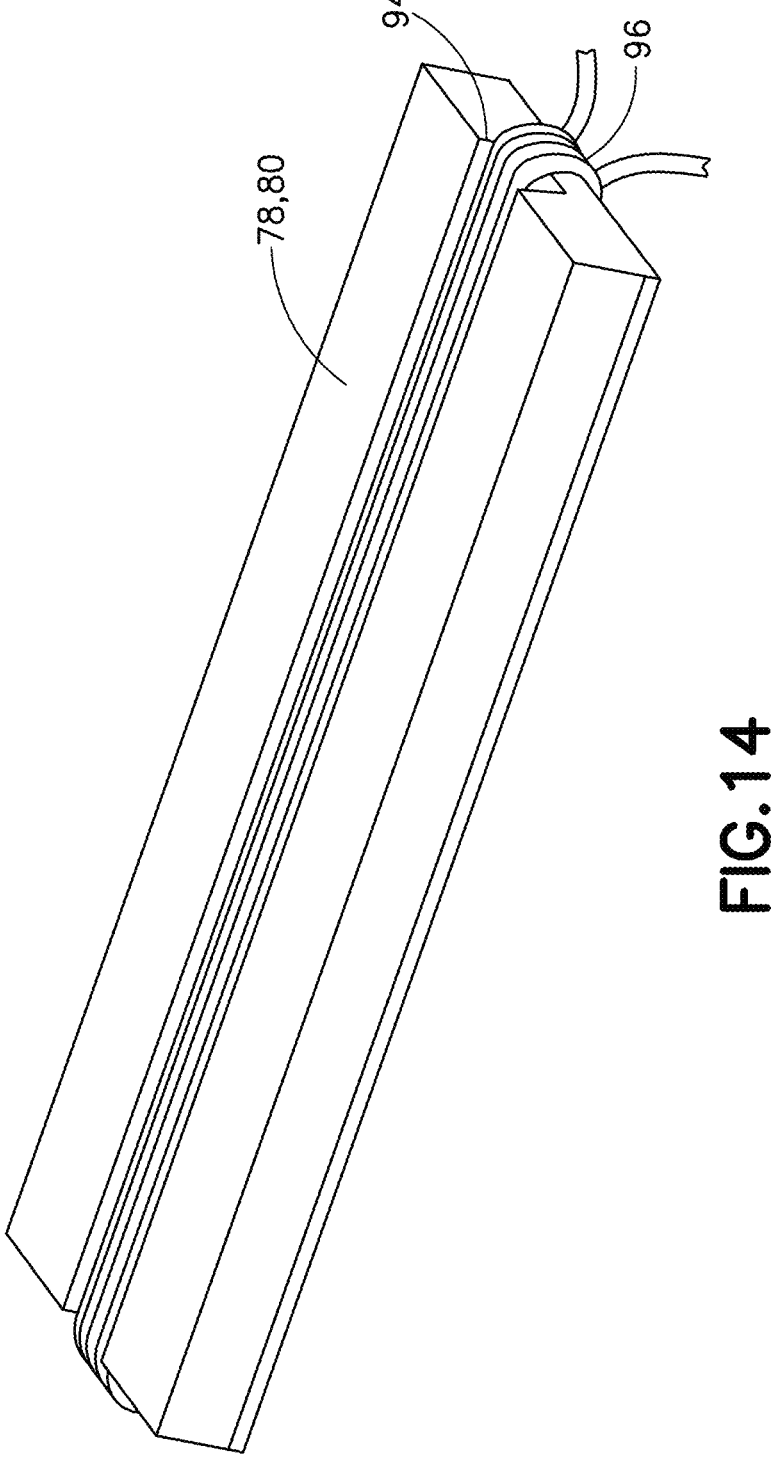
FIG. 14 is a perspective view of a power module used with the apparatus shown in FIGS. 10-11.
Figure 14A:
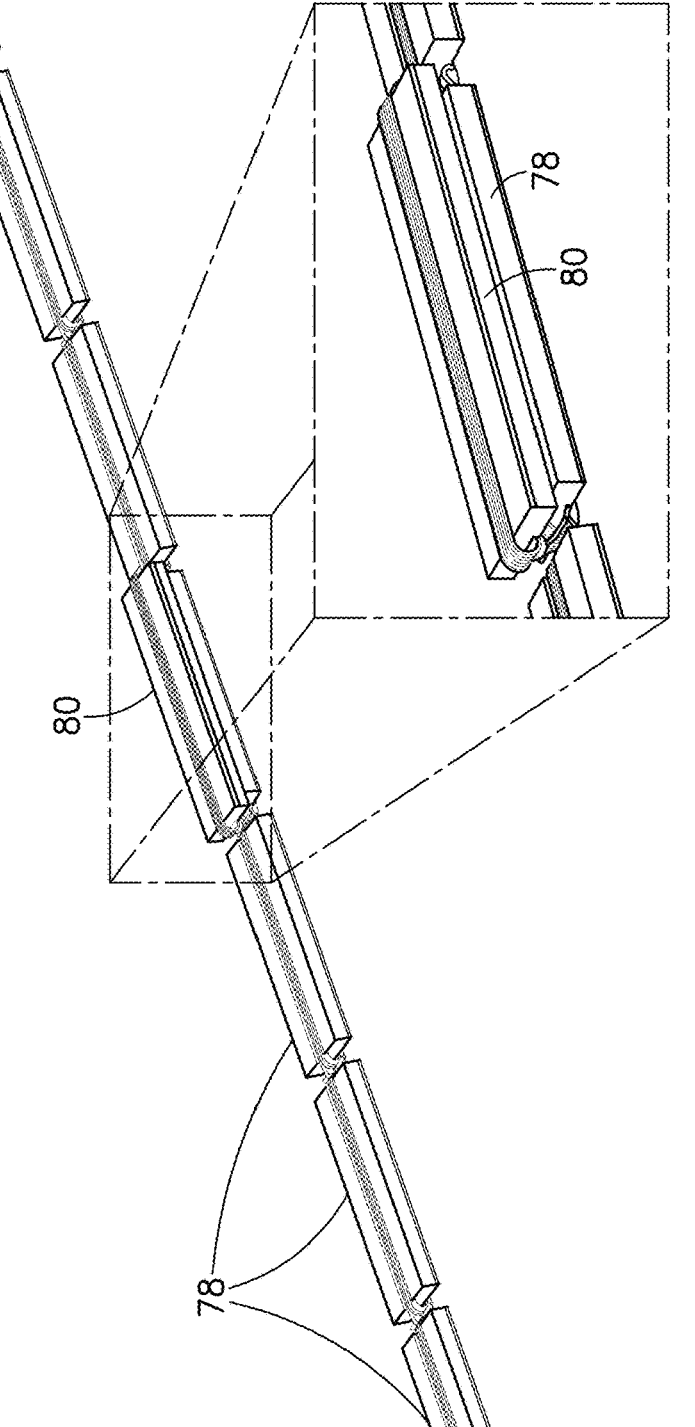
FIG. 14A is a perspective view illustrating the relative layout of a plurality of the power modules shown in FIG. 14.

Referring also to FIG. 14, the power coupling system 62, in this example embodiment, is configured to use magnetic inductional resonant effects to transfer electrical power to the substrate transport apparatus 12, such as for use with components inside the enclosure 28. The power coupling system 62 generally comprises a power coupling or module 78 on the interior bottom wall of the transport chamber 15 and a power coupling or module 80 on the exterior bottom side of the robot enclosure 28. As seen best in FIGS. 14A, 4, 10 and 11, a plurality of the primary modules 78 may be arranged aligned in a row on the bottom wall of the transport chamber 15, and the secondary module 80 may be located above the row of primary modules 78 attached to the exterior bottom side of the enclosure 28. An example of induction power transfer for a substrate transport apparatus is disclosed in US patent publication No. US 2016/0229296 A1 which is hereby incorporated by reference in its entirety. The power coupling may be combined with a communication device.

Figure 15:
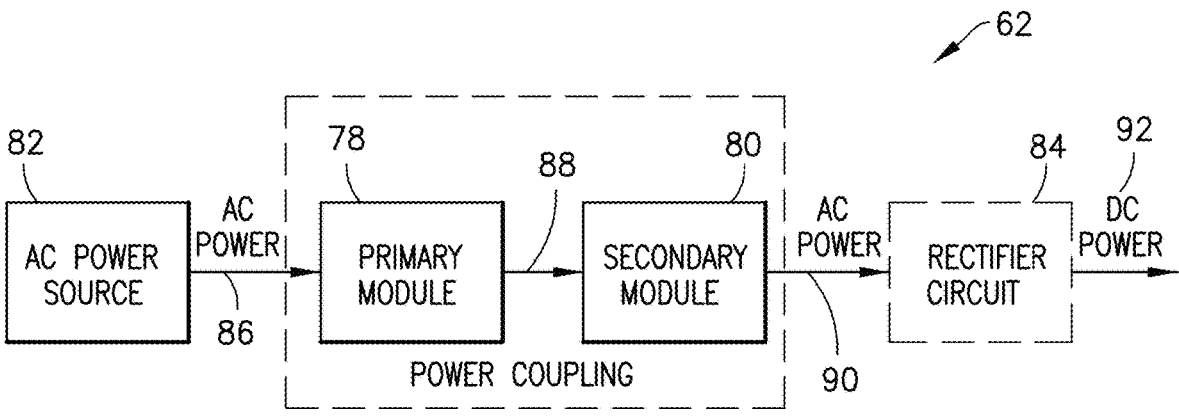
FIG. 15 is a diagram illustrating a power coupling using the power modules shown in FIGS. 14 and 14A.

Referring to FIG. 15, there is shown a block diagram representation of one example embodiment of the power coupling system 62. As depicted, the power coupling system 62 may include an AC power source 82, the power coupling with at least one primary module 78 and at least one secondary module 80, and an optional rectifier circuit 84. AC power 86 is supplied to the primary 78 where the primary 78 in turn provides power to the secondary 80 over gap 88 where the secondary 80 provides AC power 90 to the rectifier circuit 84. The secondary 80 moves with the robot enclosure 28 while the primary 78 remains stationary. However, in an alternate example, the primary and secondary modules may be configured so that they can move with respect to each other, including translation, rotation or a combination of the two. The primary and secondary may be primary or secondary cores or primary or secondary rails. In alternate aspects, any suitable combination or geometry may be provided. An electrical line(s) from the module 80 may extend through a sealed aperture in the enclosure 28 to supply electricity, such as to motors 42 of the robot and/or to a controller (such as a servo motor controller for example) and/or communication equipment and/or sensors inside the enclosure 28 or subsequently to devices in or on the robot arm assembly 36 for example. In an alternate embodiment, more than one module 80 might be provided, and might be on one or more lateral sides of the enclosure 28. Because modules 78, 80 do not contact one another, there is less risk of contamination inside the chamber 15 as the module 80 moves relative to the modules 78.

Figure 16:
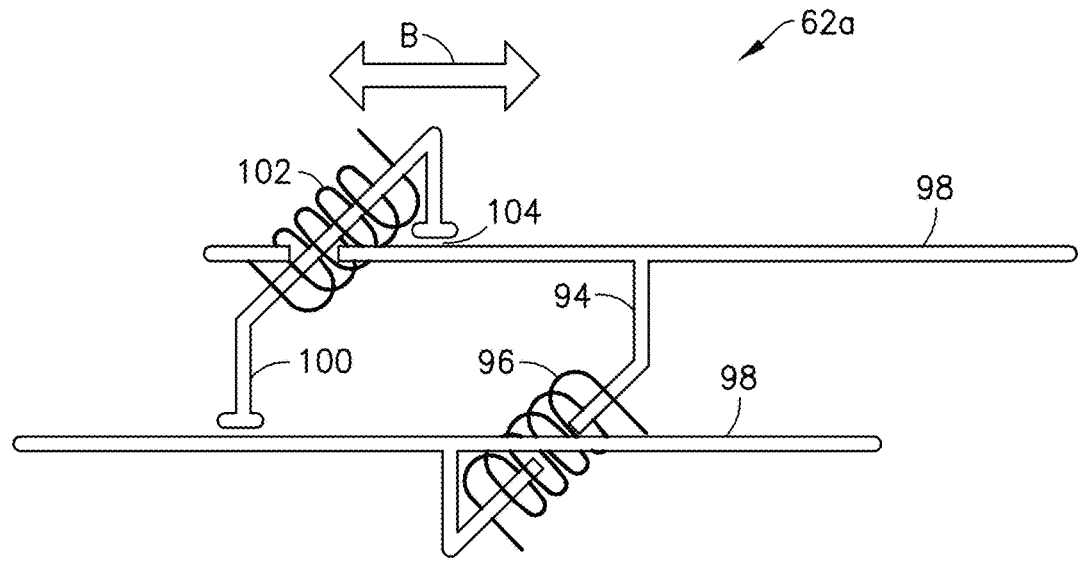
FIG. 16 is an isometric representation of one exemplary embodiment coupling shown in FIG. 15.

Referring now to FIG. 16, an isometric representation of one example alternate embodiment of the power coupling 62a is shown. As seen best in FIG. 14, the primary module(s) 78 may consist of a primary core or rail 94 and a primary winding or coil 96, which may be configured so that AC current, e.g., supplied by the AC power source 82, through the primary winding 96 produces alternating magnetic flux in the primary core or rail 94. The primary core or rail 94 may feature extensions 98 along the direction of relative motion B between the primary module 78 and secondary module 80. The secondary module 80 may consist of a secondary core or rail 100 and a secondary winding or coil 102 configured so that alternating magnetic flux in the secondary core or rail 100 induces voltage in the secondary winding 102. The secondary core or rail 100 may be arranged so that it may move as part of the secondary module along the extensions 98 of the primary core or rail 94 and so that magnetic flux may pass between the extensions of the primary core or rail and the secondary core or rail at shoe portions across an air gap 104 between the extensions 98 of the primary core or rail and the secondary core or rail 100. The output of the secondary winding 102 may be used as an AC power source directly, or, if DC power is required, the secondary winding may feed the rectifier circuit 84 (such as inside the enclosure 28 for example), which in turn may serve as a DC power source 92, as illustrated in FIG. 15. The primary winding 96 and secondary winding 102 may feature substantially the same number of turns in order for the amplitude of the output voltage of the secondary winding to be substantially equal to the amplitude of the voltage supplied by the AC power source 82. The number of turns of the secondary winding 102 may be higher than the number of turns of the primary winding 96 if higher output voltage is required. Conversely, the number of turns of the secondary winding 102 may be lower than that of the primary winding 96 if lower output voltage is required. The primary core 94 and secondary core 100 may be C-shaped, as depicted diagrammatically in FIG. 16, E-shaped, or they can feature any suitable shape that allows for inductive coupling between the primary module 78 and the secondary module 80. The extensions 98 of the primary core 94 may be straight to support straight-line motion between the primary module 78 and secondary module 80, or they may be curved to support curved or rotary motion. The primary core 94, extensions 98 and secondary core 100 may be produced from a soft magnetic material, for instance, silicon steel, soft magnetic composite, another material suitable to channel magnetic flux or a combination of such materials. Laminated construction may be utilized. Here, the primary and secondary may be considered as induction sections with the windings being coils. All the electrical wiring of the secondary module 80 may be located inside the robot enclosure 28 so that no wiring is located in the area 17. All the electrical wiring of the primary modules 78 may be located outside the transport chamber 15 so that no wiring is located in the area 17.

Data Communications Coupling System

Figure 17:
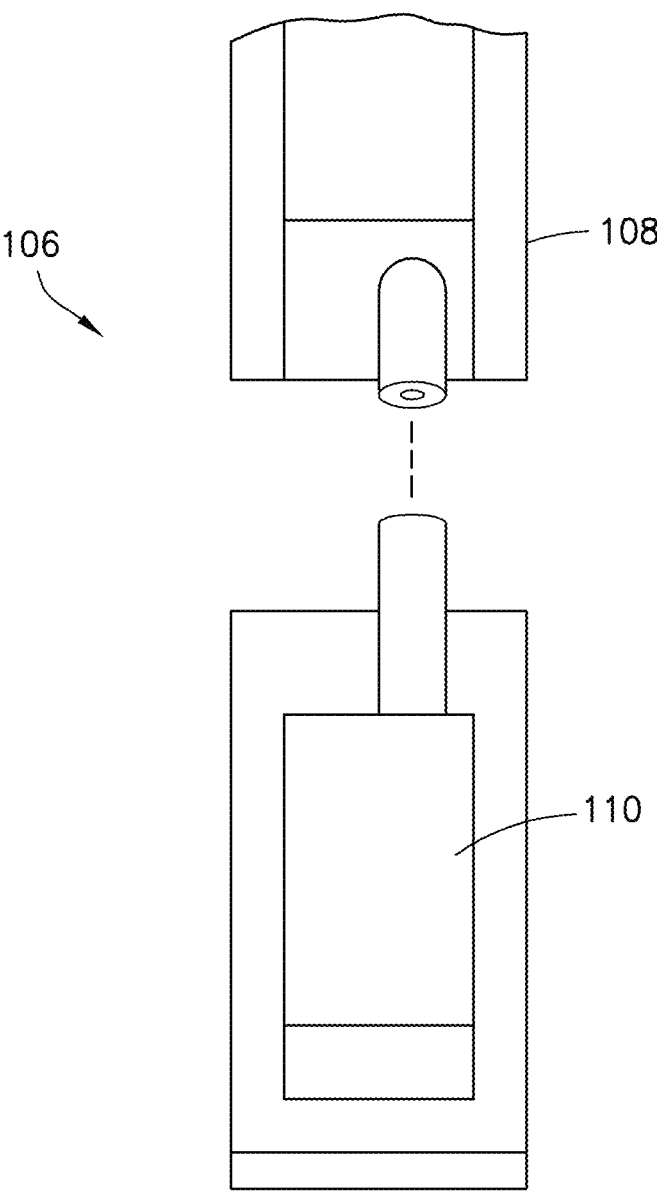
FIG. 17 is a schematic view illustrating some components of an optical communication system shown in FIGS. 10-11.

The data communications coupling system 64, in this example, comprises an optical communication system 106 which, as shown best in FIGS. 10-11 and 17, includes a first member 108 and a second member 110. The first member 108 is connected to the exterior bottom side of the robot enclosure 28. In an alternate example the first member 108 may be inside the enclosure with an optical window through the enclosure, or may be located on a side of the enclosure other than the bottom side. The second member 110 is connected to a side wall of the transport chamber 15. The second member 110 may be located outside of the area 17 and the transport chamber 15 may have a window for the two members 108, 110 to nonetheless optically communicate with each other. In an alternate example, the second member 110 may be inside the chamber 15.

The two members 108, 110 may use one or more laser beams or other optical signals 112 to transmit and receive data signal in the varying distances between the enclosure 28 and the chamber 15 as the enclosure moves inside the chamber 15. The data signals may be subsequently transmitted to and from the components inside the robot enclosure 28, such as to control the robot 26 and/or linear drive system 30, and for data from sensors of the substrate transport apparatus 12 to be sent to the controller 50. All the wiring (electrical and/or optical) from the first member 108 may be located inside the robot enclosure 28 so that no wiring is located in the area 17. All the wiring (electrical and/or optical) from the second member 110 may be located outside the transport chamber 15 so that no wiring is located in the area 17. This reduces the risk of contamination inside the area 17, such as from outgassing from those wires. The communication may be combined with power delivery.

Heat Transfer Coupling System

As noted above, the apparatus 10 may also comprise a heat transfer coupling system 66. The heat transfer coupling system 66 may be used to provide a thermal management in regard to components of the substrate transport apparatus 12 inside the robot enclosure 28; to transfer heat from inside the robot enclosure 28 to outside the transport chamber 15. This may be particularly important if the area 17 is a vacuum environment with poor heat transfer capability. The moving robot enclosure 28 serves to house all of the advanced control subsystem which move with the substrate transport apparatus 12. The moving robot enclosure 28 further serves to support the robotic transfer arm that cooperates with the moving support to transport one or more substrates between locations. As there are active components coupled to the moving robot enclosure 28, such as the motors 42 for example, the heat generated by the active components may be dissipated by a thermal management subsystem. For a moving support in vacuum, heat may be dissipated either by radiation or by transfer through a medium, for example through a gas or by coupling a bellows to the moving support and circulating gas or liquid coolant through a chiller. In the event of cooling by radiation alone (or combination radiation and convection), an allowable temperature difference between all or part of the moving portion and the chamber may be specified, for example, 50 degrees Celsius or otherwise. With the example embodiment shown in the figures, non-contacting interleaving fin-like structures 120, 122 (see FIGS. 2-4 and 10-11) may be employed to maximize opposing surface areas. High emissivity coatings may also be utilized to maximize surface area related heat transfer. An example of suitable coatings may be aluminum oxide, aluminum nitride or any suitable high emissivity coating. In alternate aspects, any suitable surface or coating may be provided. For a moving support in a gas or inert environment, heat may be dissipated either by radiation or convection or both. As there are active components coupled to the moving support 28, power and communication may be transferred to the moving support subsystem with the power coupling 62 and the communication coupling 64 as described with the above example. Power and communication may be transferred to the moving support subsystem wirelessly as described with the above example, by inductive coupling, via service loop or a combination of these approaches.

Active components coupled to the support may be potted with vacuum compatible potting or epoxy or alternately be hermetically sealed within the enclosure 28 or a combination of both. Examples of suitable moving support thermally sunk subsystems are disclosed in Hosek M., Hofmeister C., Low Variability Robot, U.S. patent application Ser. No. 13/618,117, Sep. 14, 2012, U.S. Patent Publication Number US 2013/0071218 A1, which is hereby incorporated by reference herein in its entirety. However, because of the use of the robot enclosure 28, use of potting or epoxy may be reduced or eliminated.

Example Alternatives

Figures 18, 18A:
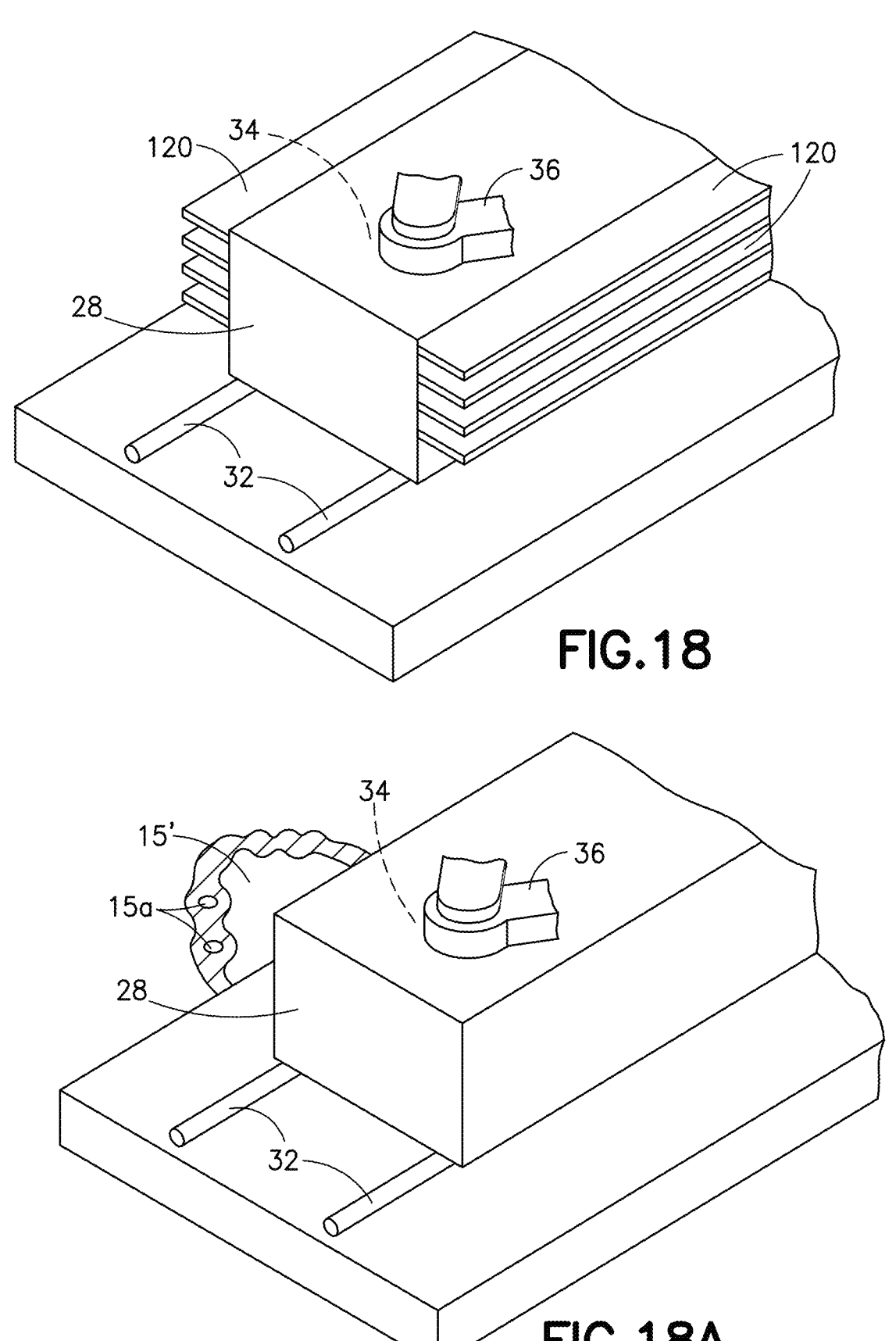
FIG. 18 is a perspective view of the substrate transport apparatus on the bottom wall of the transport chamber.
FIG. 18A is a perspective view of an alternate embodiment of the substrate transport apparatus on the bottom wall of the transport chamber.

Referring also to FIG. 18 an alternate example embodiment is shown. This embodiment is similar to that shown in FIGS. 2-4, but has a reduced form factor. The linear motor is enclosed, there are shield linear bearings, and a protected optical link. The heat transfer fins might not be needed under some scenarios. Referring also to FIG. 18A another alternate example embodiment is shown. This embodiment is similar to that shown in FIG. 18, but in this example the enclosure 28 does not comprise heat transfer fins. In this type of embodiment, the wall cooling may be provided in the wall of the enclosure 28 and/or the walls of the vacuum chamber, such as running coolant through the chamber walls when there are no fins for cooling. However, such a cooling system could be used in conjunction with fins. FIG. 18A shows an example of cooling conduits 15a in the wall of the chamber 15'.

In some embodiments the cooling of the robot may be enhanced by cooling of the vacuum chamber walls. Heat can be transferred from the robot drive to the vacuum chamber wall through radiation or convection, or some combination of the two. Regardless of the mechanism of heat transfer from the robot drive to the vacuum chamber, the quantity and rate at which heat is transferred may be enhanced by cooling of the chamber walls. Cooling of the chamber walls may be achieved by several different methods, or a combination thereof. In one example embodiment the cooling may be achieved by integration of cooling channels of vents, directly or indirectly on the vacuum chamber walls. A continuous, or intermittent flow of a working fluid, which can be a liquid, or a gas, or a combination of two, such that the working fluid has an initial inlet temperature lower than the vacuum chamber wall temperature, may be employed to achieve cooling of the vacuum wall temperature. This results in enhanced cooling of the robot drive. In an alternative embodiment, thermoelectric cooling tiles may be employed to cool the surfaces of the vacuum chamber, such that heat is rejected at a higher temperature on the hot side of the thermoelectric tiles, thus enabling more effective cooling.

Figure 19:
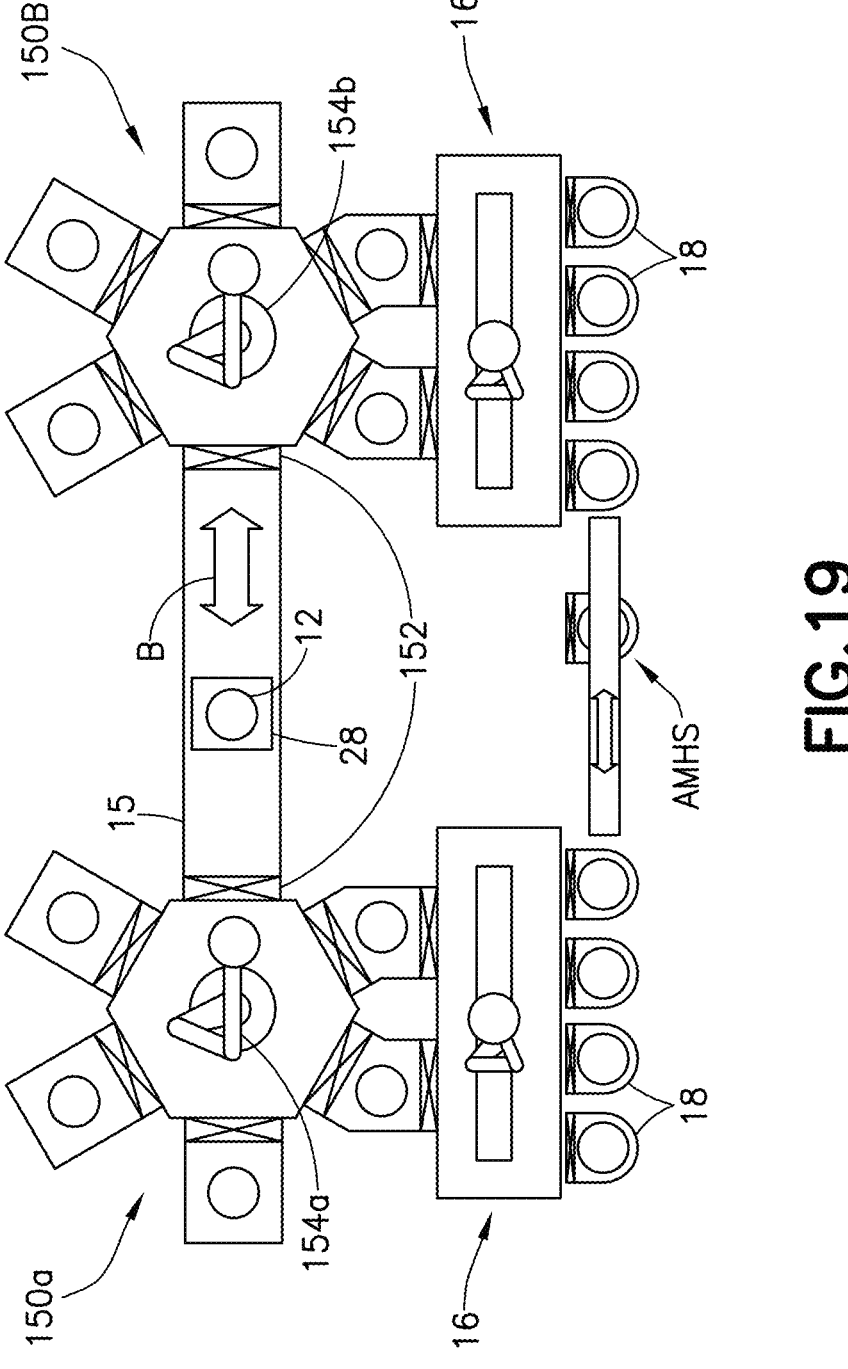
FIG. 19 is a schematic top view of a substrate processing apparatus comprising features as described herein.

Referring also to FIG. 19, an alternate example embodiment is shown. In this example the system is used between two cluster tools 150a, 150b. The chamber 15 has load locks 152 at opposite ends which are coupled to the tools 150a, 150b. The robot enclosure 28 and attached robot 26 can move as indicated by arrow B for transporting substrates between the tool robots 154a, 154b. The robot may also be used in a vacuum EFEM as in FIG. 1.

Features

One of the features as described herein is the ability of the robot enclosure 28 to function as a cart to linearly move inside the transport chamber 15 carrying all necessary components for the substrate transport apparatus 12 and the only physical contact with the transport chamber 15 being on the rails 32. However, even that contact with the rails 32 may be eliminated if a maglev system is used.

Another feature as described herein is that virtually all components of the substrate transport apparatus 12, except for the robot arm assembly 36 and top portions of the robot drive shafts, may be isolated inside the robot enclosure 28 within the area 29. The area 29 may have an atmosphere which is not a vacuum; even if the area 17 is in vacuum. This allows the robot 26 to not be a vacuum compatible robot (a non-vacuum compatible robot). With a non-vacuum compatible robot outgassing is not a significant factor in its design and manufacture. Thus, without having to provide a low or nil outgassing design, a non-vacuum compatible robot is less expensive than a vacuum compatible robot. The robot enclosure 28 may also have a window for the optical communications such that the member 108 may be located totally inside of the robot enclosure 28. The power coupling 80 may also be located totally inside of the robot enclosure 28 with a portion of the robot enclosure 28 having a magnetically transparent section for the two power couplings 78, 80 to function properly with induction. The transport chamber 15 may be provided with a linear encoder 156 as shown in FIG. 10 to sense the linear location of the robot enclosure 28 on the rails 32. All communications with the components in and/or on the robot enclosure 28 may be done optically or wirelessly, or through a power coupling, such that no communication electrical wires or optical wires need to traverse the area 17.

With features as described herein, a robot drive 34 may be sealed by a hermetically sealed robot enclosure 28. Thus, the transport chamber 15 might only need the rails 32 for the substrate transport apparatus 12 to move along, and no other direct physical contacts being made by the transport chamber 15 to the robot enclosure 28 or the substrate transport apparatus 12. Even with a non-maglev embodiment, a gap or spacing may always be provided between the transport chamber 15 and the substrate transport apparatus 12 at all other locations except at the rails 32. This reduces contamination of the area 17 by the substrate transport apparatus 12 because of such non-contact.

Modular Platform

Features as described herein may be used to provide a material-handling platform with a traversing vacuum-environment robot which is modular. A modular system may allow for scalability and eliminate the need to manufacture and transport oversized components. The modular features may be used in conjunction with one or more of the features described above, or in a totally different system.

Figures 20A, 20B:
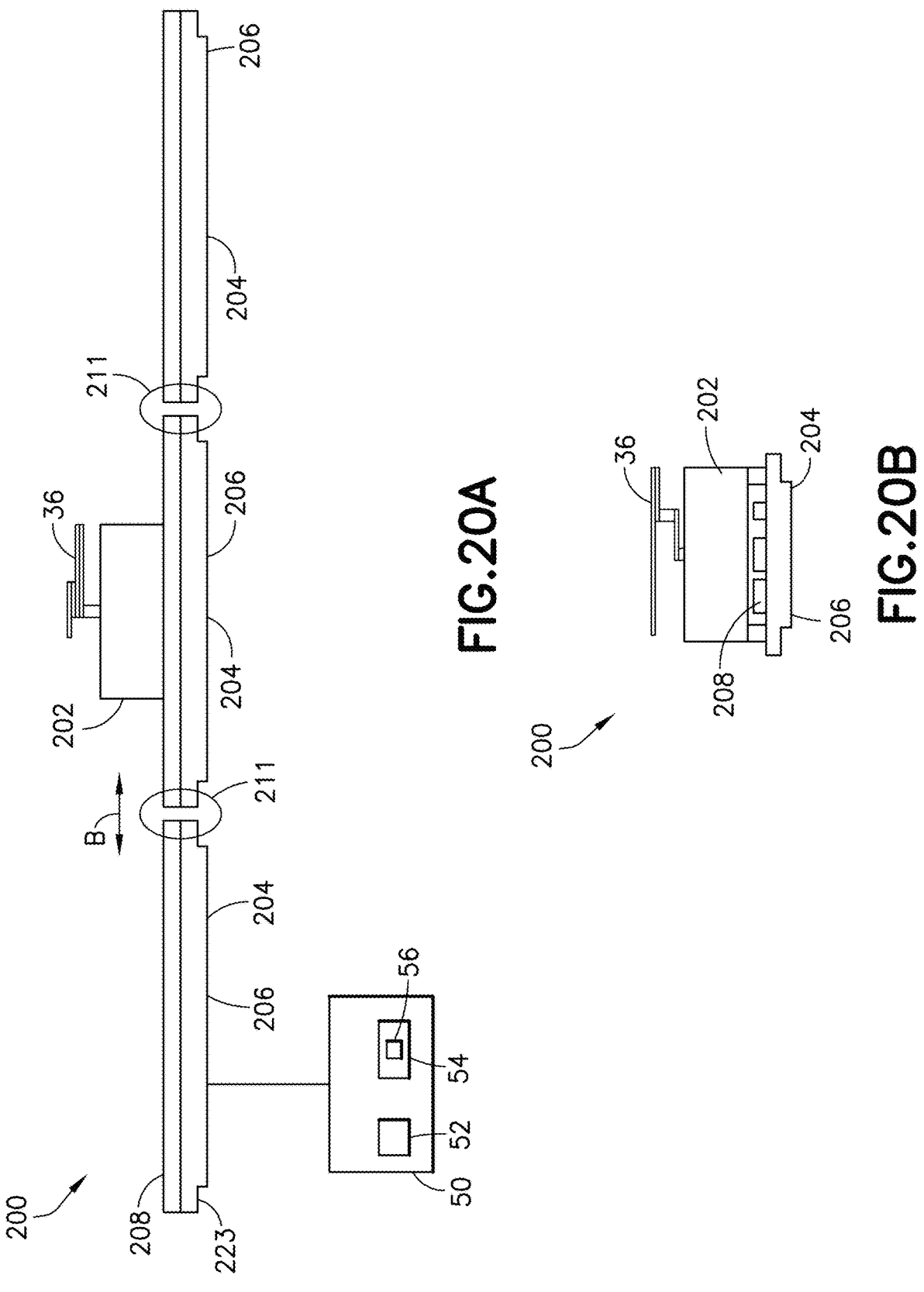
FIG. 20A is a schematic side view of a material-handling robot platform comprising features as described herein.
FIG. 20B is an end view of the platform shown in FIG. 20A.
Figures 20C, 20D:
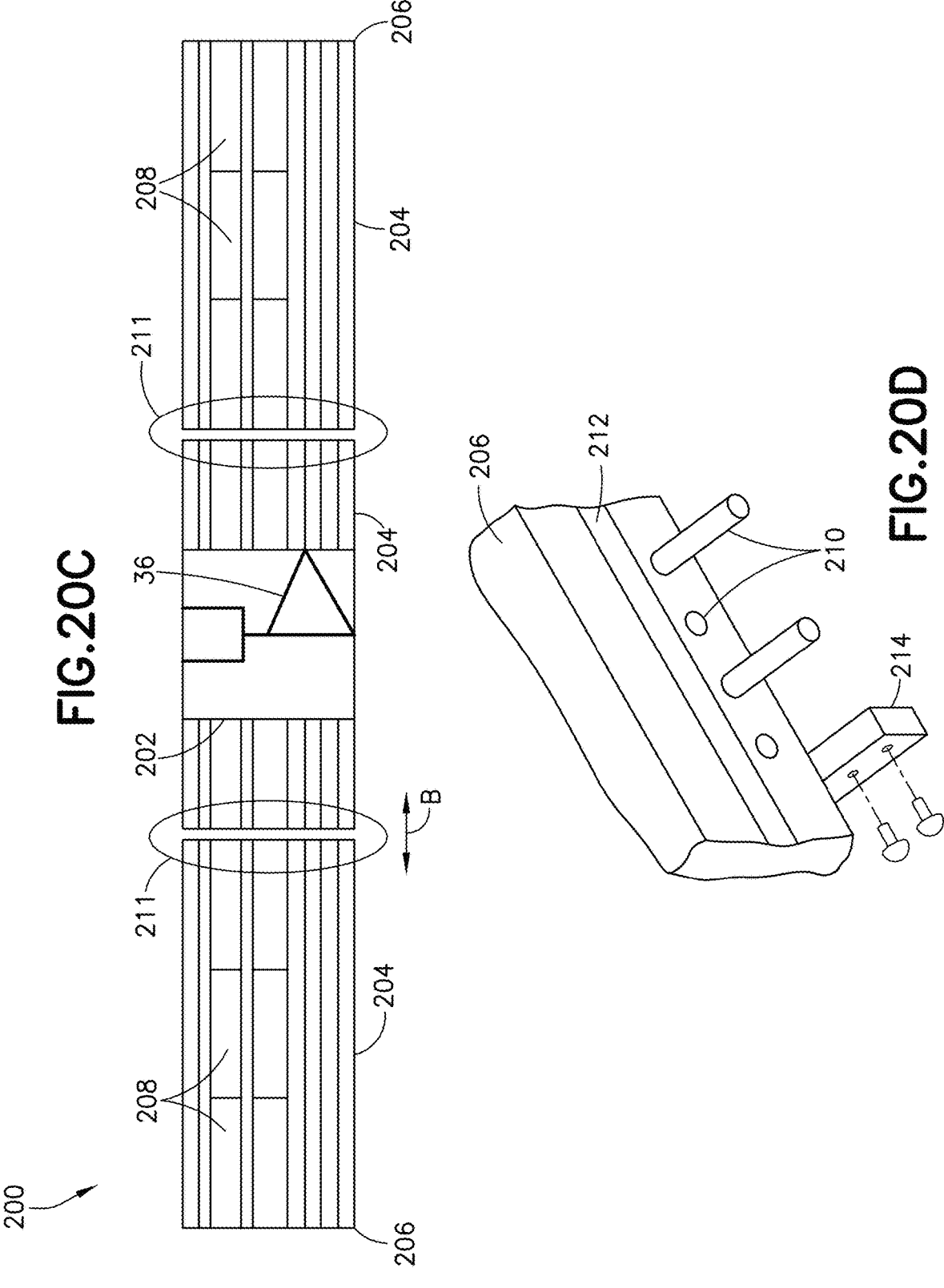
FIG. 20C is a top plan view of the platform shown in FIG. 20A-20B.
FIG. 20D is a partial perspective view of an end of one of the base plate assemblies of the platform shown in FIGS. 20A-20C.

An example embodiment of a material-handling robot platform 200 comprises features as described herein is depicted diagrammatically in FIGS. 20A-20D. As shown in these figures, the platform 200 may consist of a robot drive unit 202 with a robot arm 36 and a controller 50, and one or more base plate assemblies (modules) 204. As an example, three base plate assemblies 204 are shown in FIGS. 20A-20C. However, more or less than three base plate assemblies 204 could be provided. The controller 50 comprises at least one processor 52 and at least one memory 54 comprising computer program code 56. The controller 50 is configured to control operations of the various devices and robots of the apparatus 200. The robot drive unit 202 may comprise features as described above including the linear drive system 30 and the robot drive 34. However, other types of drives could alternatively be used. Also, any suitable robot arm assembly could be provided.

The base plate assemblies 204 might be identical, or could have different features. Each base plate assembly 204 may comprise a base plate 206 and various modules 208 that may facilitate traversing motion of the robot drive unit 202 along each base plate assembly 204. For instance, these modules 208 may include rails (such as, for example, for mechanical linear bearings or magnetic bearings), power delivery arrangements (such as, for example, a service loop, arm, contactless power coupling modules), communication arrangements (such as, for example, a service loop, arm, wireless radio frequency modules, optical communication modules, communication over a contactless power coupling), linear electric motor (such as, for example, a magnet track, stator segments, etc.) and linear position encoder (such as, for example, a scale for an optical, magnetic, inductive or capacitive position encoder read-head). The modules may be contained entirely on individual baseplate assemblies 204. Alternatively, the modules may be installed so that they span across two or more adjacent baseplates.

The transport chamber 15 may be provided with a linear encoder 156 as shown in FIG. 10 to sense the linear location of the robot enclosure 28 on the rails 32. The linear position encoder may comprise one continuous position track, or multiple in-line position tracks and using multiple read heads. All communications with the components in and/or on the robot enclosure 28 may be done optically or wirelessly, or through a power coupling, such that no communication electrical wires or optical wires need to traverse the area 17. The sensor(s) may comprise a position encoder, such as an optical, magnetic, inductive or capacitive position encoder, a laser interferometer or any other suitable device capable of measuring the position of the robot drive unit along the desired direction of traversing motion, such as relative to the chamber 15 for example. Utilizing the measurements from the position sensor(s), the force produced by the linear actuator may be used to control the position of the robot drive unit along the direction of the desired traversing motion of the robot. In order to support a modular design of the vacuum chamber (i.e., a vacuum chamber composed of multiple sections), an additional encoder read-head for the linear actuation system and/or additional position sensors for the magnetic support system may be utilized to enable smooth transition between individual sections of the vacuum chamber. Specifically, in the case of mechanical linear bearings, the stationary rail may extend by a small extent outside the base plate 206 to allow smooth transfer in the case of rectangular arrangement of linear tracks. Other arrangements, such as triangular, may not need this feature.

The base plate assemblies 204 may be configured so that they can be arranged next to each other. This arrangement is configured to allow the robot drive unit 202 to traverse from one base plate assembly 204 to another base plate assembly 204 as illustrated by arrow B. To that end, each base plate assembly 204 may feature an alignment arrangement 210, such as shown in FIG. 20D for example, to allow two neighboring base plate assemblies 204 to be vertically and laterally aligned at joints 211 and provide smooth transition of the robot drive unit 202 between the two neighboring base plate assemblies 204. As an example, the alignment arrangement 210 may be formed by precision mating surfaces of a suitable geometry, or by a system of pins and cylindrical and/or oval holes.

The base plate assembly 204 may further include a sealing feature 212 that may facilitate a sealed joint at the joint 211 when installed into a vacuum chamber. As an example, the sealing feature 212 may include a polished sealing surface, a coated sealing surface, a groove for a sealing element and/or a sealing element, such as an O-ring.

The base plate assembly 204 may further include a mechanical connection feature 214 between the base plate assembly 204 and a vacuum chamber, such as holes, threaded studs, threaded fasteners or clamps for example. The mechanical connection feature 214 and the base plate 206 itself may be configured so that the various modules 204 that may facilitate traversing motion of the robot drive unit 202 can directly line up with the corresponding modules on the neighboring base plate assembly 204.

Figure 20E:
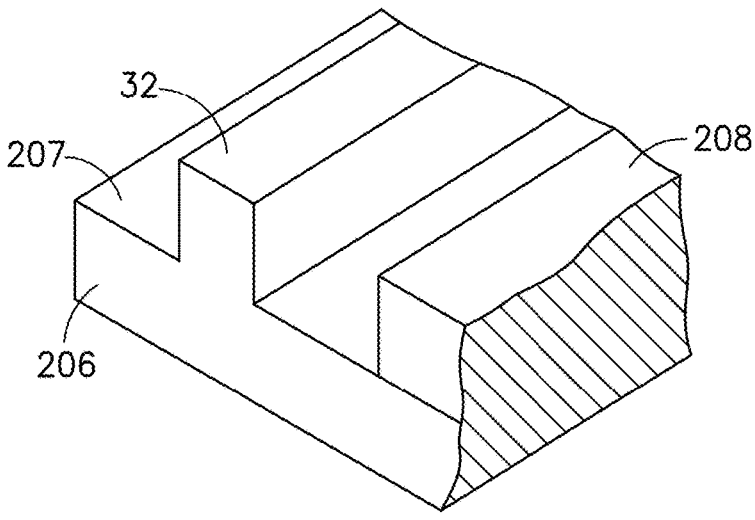
FIG. 20E is a partial perspective view of a rail or maglev guide integrally formed on a base plate assembly.
Figure 20F:
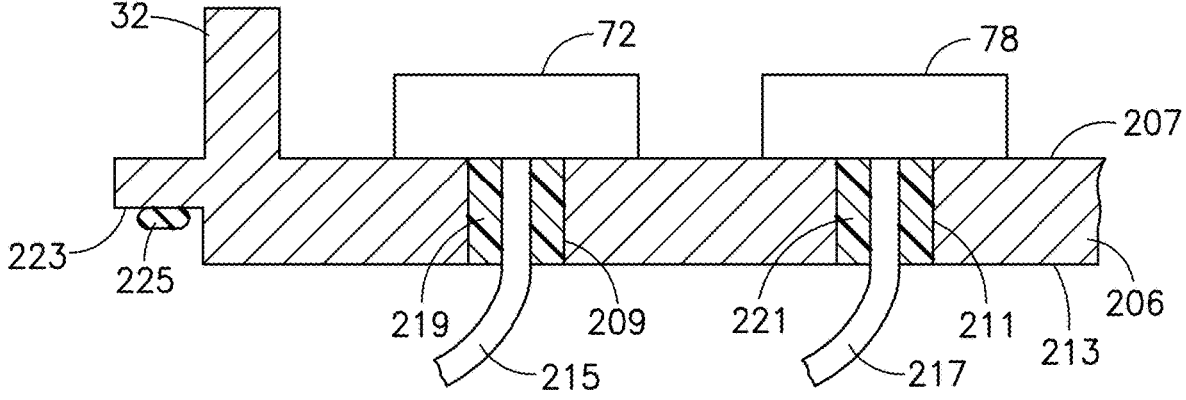
FIG. 20F is a partial cross sectional view of one of the base plate assemblies showing some of the apertures and seals.

Referring also to FIG. 20E, the base plate 206 may be comprises of metal with the rails 32 integrally formed therewith. Alternatively, the rails may be separately formed and subsequently connected to the top side 207 of the base plate 206. In this example, the modules 208 are attached to the top side 207 of the base plate 206. The modules may comprise, for example, a plurality of the magnetic drivers 72 and a plurality of the power coupling 78; aligned along the longitudinal length of the base plate 206. As illustrated in FIG. 20F, the base plate 206 may comprise apertures 209, 211 therethrough between the top side 207 and the bottom side 213. Electrical wires 215, 217 from the modules 72, 78 may pass through the apertures 209, 211 to the controller 50 or other electrical supply/controllers. Seals 219, 221 may be provided at the apertures 209, 211 to seal apertures 209, 211.

Figures 21A, 21B, 21C:
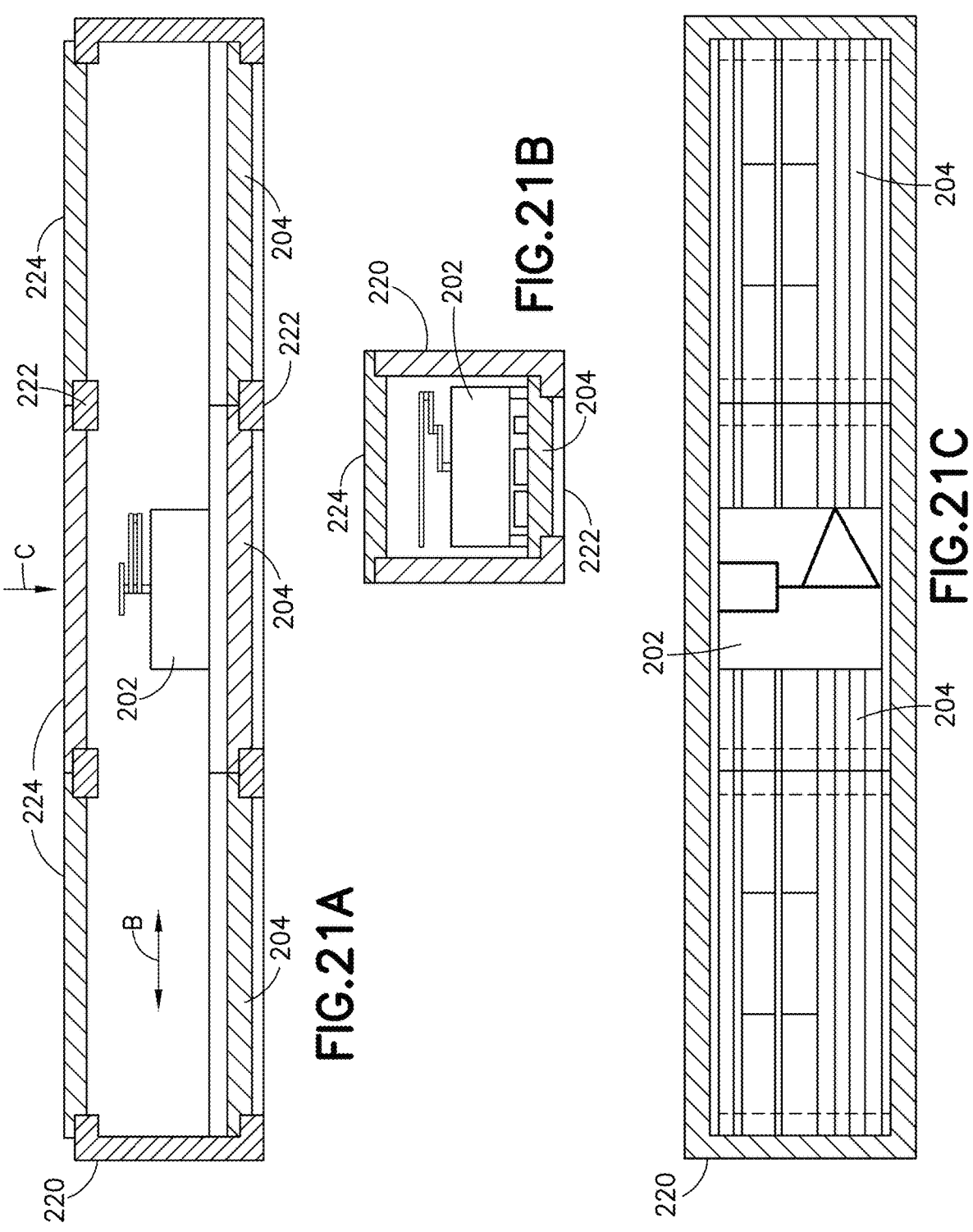
FIG. 21A is a schematic side view of a material-handling robot platform and cross section of a chamber comprising features as described herein.
FIG. 21B is an end cross sectional view of the platform shown in FIG. 21A.
FIG. 21C is a top cross sectional view of the platform shown in FIG. 21A-21B.

As illustrated in FIGS. 21A-21C, multiple base plate assemblies 204 may be integrated into a vacuum chamber 220. In the example of FIGS. 21A-21C, three base plate assemblies 204 are used. As shown in the figure, the vacuum chamber 220 may include one or more transverse ribs 222 to provide structural strengths. The chamber may also be fitted with one or more lids 224. As a feature of the present invention, the above described design of the base plate assemblies 204 allows for the base plate assemblies to be installed from the top of the chamber as indicated by arrow C so that each base plate assembly directly faces another base plate assembly without interruptions due to the transverse ribs 222; thus facilitating uninterrupted traversing motion of the robot drive unit 202 along the entire length of the vacuum chamber 220 as indicated by arrow B.

In this embodiment the base plate 206 has ledges 223 (see FIGS. 20F and 20A for example) at the bottom side at the opposite lateral sides and the opposite ends. The frame of the vacuum chamber has apertures through its bottom side as shown best in FIG. 21A. The base plates 206 may be placed at the apertures to close the apertures and form at least part of the bottom wall of the vacuum chamber. The ledges 223 may sit on top of bottom portions of the vacuum chamber frame with seals 225 (see FIG. 20F) forming a seal at the joints.

Figures 22A, 22B, 22C:
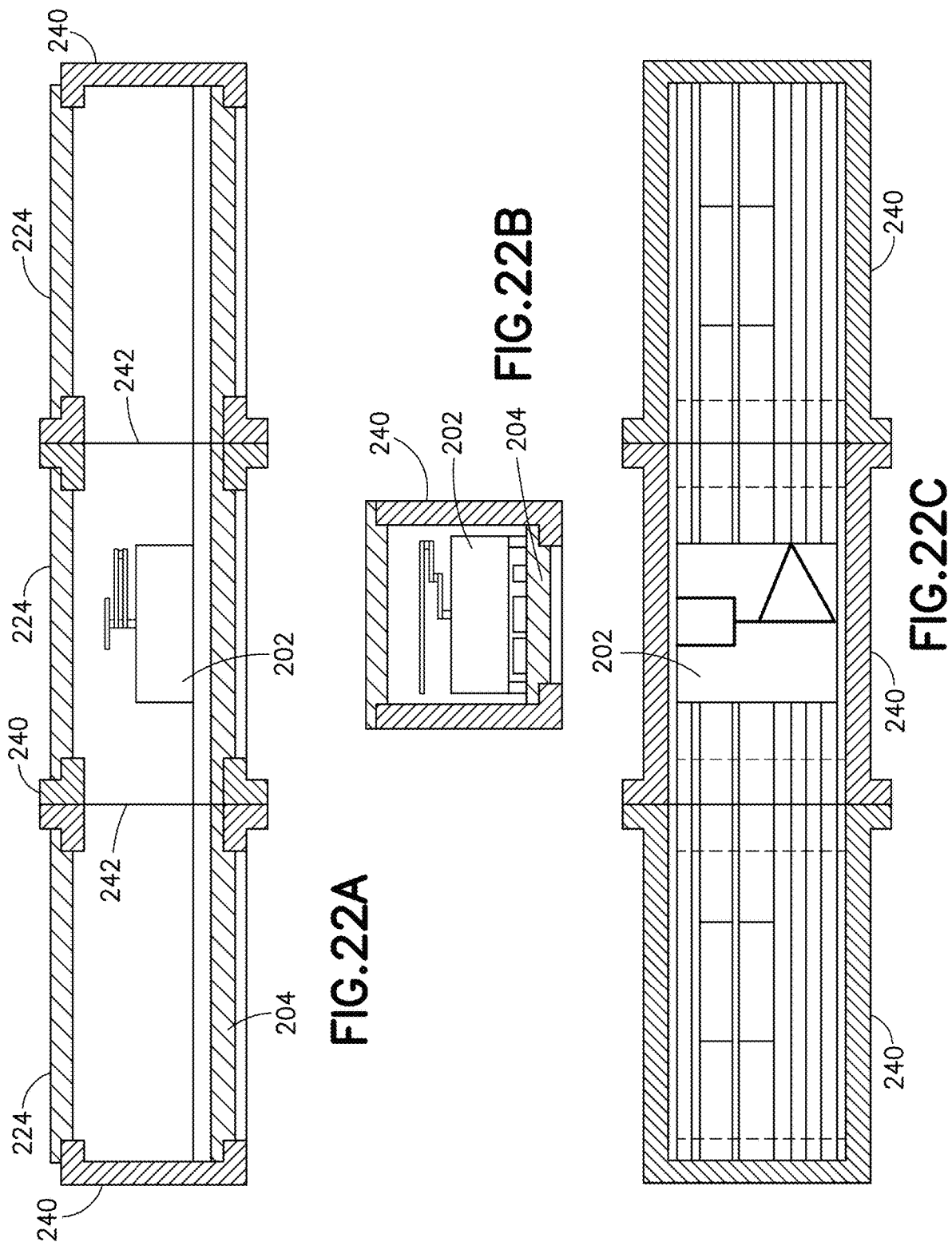
FIG. 22A is a schematic side view of a material-handling robot platform and cross section of a chamber comprising features as described herein.
FIG. 22B is an end cross sectional view of the platform shown in FIG. 22A.
FIG. 22C is a top cross sectional view of the platform shown in FIG. 22A-22B.

In order to further avoid fabrication and transportation of oversized components, the vacuum chamber may be divided into sections 240, as illustrated in FIGS. 22A-22C. In the example of FIGS. 22A-22C, three sections 240 are shown. The chamber sections may be fitted with one or more lids 224. Each section 240 may utilize one or more base plate assemblies 204 installed in the manner described above with respect to FIGS. 21A-21C. The sections 240 may include connecting and sealing features 242 at the joints of the sections 240 such as 212 in FIG. 20D for example. The sealing features may also be used perhaps at other areas, such as the ends of the chamber. This allows one section 240 to be attached to the next section 240 with a seal therebetween around the entire interior open area; a type of square or rectangle in this example, such as seen by the shape in FIG. 22B. As an example, flanges with fasteners or clamps may be utilized for mechanical connection. Polished sealing surfaces, coated sealing surfaces, grooves for sealing elements and/or various sealing elements, such as O-rings, may be used to achieve proper sealing. These are merely some examples and should not be considered limiting.

Figure 24:
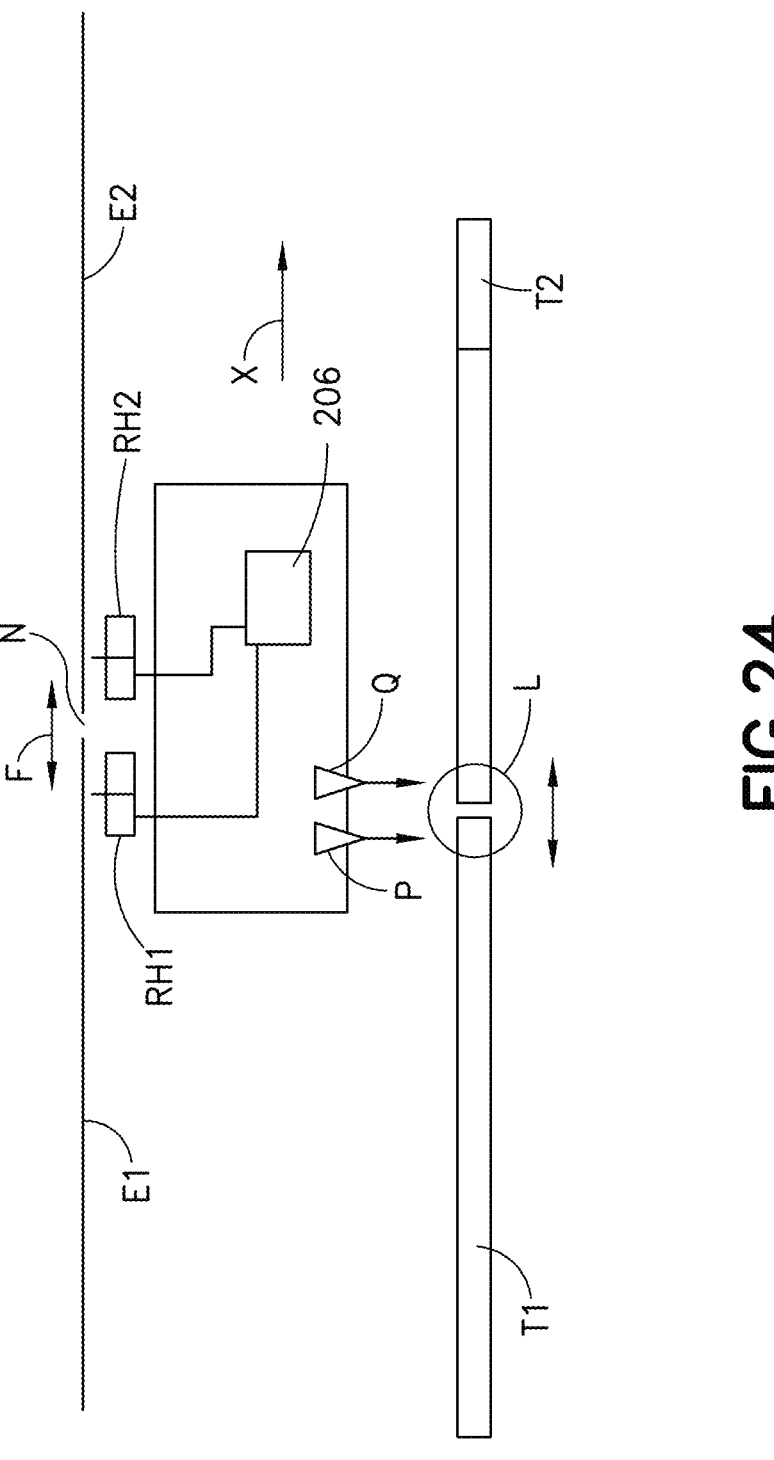
FIG. 24 is a diagram illustrating use of multiple sensors to account for transitions between linear maglev tracks/guides and maglev gap sensor targets.

It is noted that as the X axis motion range for the linear vacuum robot becomes very large, it becomes challenging to build a position track for the position sensor which is a part of the linear actuator system described earlier. To overcome this limitation, a segmented position track approach with dual position sensors is disclosed here. With reference to FIG. 24, as the robot drive traverses in the X direction, both positions sensors RH1, RH2 generate valid position data offset by spacing length F at all instances except when one or the other of the sensors RH1, RH2 is targeting the transition between the ends of the two position tracks E1, E2. Note the gap or transition N. The disclosed solution overcomes the period at which one sensor data is invalid by switching over to the other sensor. Since the sensors RH1, RH2 are physically offset relative to the length of the guides/tracks E1, E2, at least one of the sensors RH1, RH2 always reports valid position. Since the location of the transition N between tracks E1, E2 is a design quantity, it is known ahead of time and the controller 2406 makes a decision based on the known location of the transition N to switch between the sensors RH1, RH2. In other embodiments, algorithms may be implemented to use, merge or combine the data from the sensors RH1, RH2 to achieve a gradual or smooth transition of data as the active sensor is switched. During periods of time where data from both sensors is valid, the data from both may be combined or merged in various manners to achieve higher accuracy, resolution, reliability, or noise rejection.

It is noted that as the X axis motion range for the maglev supported robot becomes very large, it becomes challenging to build smooth and continuous surfaces for the gap sensors to target. With reference to FIG. 31, there are two vertical sensors P, Q targeted at target T1, T2. There is a break/transition in the targets T1, T2 at location L. The gap measurement from either sensor is valid as long as they are not traveling through the location L. The controller 2406 makes a decision based on X motion location from sensor RH1, RH2 on time instants when the gap sensor is transitioning through L. The informed algorithm is implemented on the controller 2406 to use the gap data from P or Q.

An example embodiment may be provided with an apparatus comprising: a first base plate, where the first base plate is configured to have at least one linear drive component and/or at least one power coupling component connected to a top side of the first base plate, where the first base plate is configured to be located inside a vacuum chamber; and a plurality of rails or transport guides on the top side of the first base plate; where an end of the first base plate comprises at least one alignment feature configured to align an end of the first base plate to an end of a second base plate, where the first base plate is configured to provide, in combination with the second base plate, a structural platform inside the vacuum chamber for a robot drive to move in the vacuum chamber along the plurality of transport guides.

The at least one alignment feature may be configured to align the plurality of transport guides with transport guides of the second base plate. The at least one alignment feature may comprise at least one projection extending from the end of the first base plate and at least one recess extending into the first end of the first base plate. The end of the first base plate may comprise at least one mechanical connection feature projecting from the end of the first base plate, where the at least one mechanical connection feature is configured to be mechanically attached to the second base plate with at least one fastener. The first base plate may be configured to be mechanically attached directly to the vacuum chamber at a bottom side of the vacuum chamber. The first base plate may be configured to form at least a portion of a bottom wall of the vacuum chamber. The first base plate may close an aperture through the bottom of the vacuum chamber. The first base plate may comprise first ledges on two opposite lateral sides of the first base plate, where the first ledges are configured to sit on top of shelves formed by the vacuum chamber on opposite lateral side of the vacuum chamber. The first base plate may comprise second ledges on two opposite ends of the first base plate, where the second ledges are configured to sit on top of shelves formed by the vacuum chamber extending transversely across the vacuum chamber. The first base plate may comprise apertures therethrough configured to have electrical wires extend through the first base plate from a bottom side of the first base plate of the top side of the first base plate, and the apparatus further comprises seals configured to seal the apertures with the wires. The apparatus may further comprise the vacuum chamber, where the vacuum chamber comprises a plurality of main sections configured to be attached to one another in an end-to-end configuration to form an elongate shaped frame having the first base plate connected thereto, where the main sections comprise opposite lateral side walls and a bottom wall portion, and at least one lid section configured to be removably connected to top sides of the opposite lateral side walls. The apparatus may further comprise the at least one linear drive component connected to the top side of the first base plate, where the at least one linear drive component is configured to provide a magnetic field to move the robot drive along the plurality of transport guides. The apparatus may further comprise the power coupling component, where the power coupling component is configured to transfer power to another power coupling component on the robot drive, where the transfer of power is with induction.

An example method may be provided comprising: connecting a first base plate assembly inside a vacuum chamber, where the first base plate assembly comprises a first base plate and a first plurality of rails or transport guides on a top side of the first base plate; and connecting a second base plate assembly inside the vacuum chamber, where the second base plate assembly comprises a second base plate, where an end of the second base plate is connected to an end of the first base plate, where the first base plate assembly comprises at least one alignment feature configured to align the end of the first base plate to the end of the second base plate, where the first base plate is configured to provide, in combination with the second base plate, a structural platform inside the vacuum chamber for a robot drive to move in the vacuum chamber along the first plurality of transport guides.

The second base plate assembly may comprise a second plurality of rails or transport guides on a top side of the second base plate, where the connecting of the second base plate assembly inside the vacuum chamber comprises the at least one alignment feature causing aligning of the second plurality of transport guides with the first plurality of transport guides. The connecting of the first base plate assembly inside a vacuum chamber may comprise the first base plate forming at least a portion of a bottom wall of the vacuum chamber. The first base plate may close an aperture through the bottom of the vacuum chamber. The connecting of the first base plate assembly inside the vacuum chamber may comprise the first base plate including first ledges on two opposite lateral sides of the first base plate, where the first ledges sit on top of shelves formed by the vacuum chamber on opposite lateral side of the vacuum chamber. The connecting of the first base plate assembly inside the vacuum chamber may comprise the first base plate including second ledges on two opposite ends of the first base plate, where the second ledges sit on top of shelves formed by the vacuum chamber extending transversely across the vacuum chamber.

An example method may be provided comprising: providing a base plate; providing a plurality of rails or transport guides on a top side of the base plate; providing an end of the base plate with at least one alignment feature configured to align the end of the first base plate to an end of a second base plate; connecting to the top side of the base plate at least one of: a power coupling component configured to transfer power to another power coupling component on a robot drive, where the transfer of power is with induction, or a linear motor component configured to provide a magnetic field to move the robot drive along the plurality of transport guides, where the base plate is configured to be connected inside a vacuum chamber with the second base plate to provide a structural platform inside the vacuum chamber for the robot drive to move in the vacuum chamber along the first plurality of transport guides.

An example embodiment may be provided in an apparatus comprising means for connecting a first base plate assembly inside a vacuum chamber, where the first base plate assembly comprises a first base plate and a first plurality of rails or transport guides on a top side of the first base plate; and means for connecting a second base plate assembly inside the vacuum chamber, where the second base plate assembly comprises a second base plate, where an end of the second base plate is connected to an end of the first base plate, where the first base plate assembly comprises at least one alignment feature configured to align the end of the first base plate to the end of the second base plate, where the first base plate is configured to provide, in combination with the second base plate, a structural platform inside the vacuum chamber for a robot drive to move in the vacuum chamber along the first plurality of transport guides.

An alternative means to reduce fabrication and transportation of oversized components is to eliminate the baseplate 204 of FIGS. 20-21. FIGS. 23A-23C show an example of an embodiment where the base plate is an integral part of the chamber 241. The chamber may be one-piece or segmented pieces as illustrated in FIG. 23A. All the features and components required to facilitate traversing motion of the robot drive unit 202 may be installed directly on the floor (or walls) of the chamber 241, such as rails or transport guides (such as, for example, for mechanical linear bearings or magnetic bearings), power delivery arrangements (such as, for example, a service loop, arm, contactless power coupling modules), communication arrangements (such as, for example, a service loop, arm, wireless radio frequency modules, optical communication modules, communication over a contactless power coupling), linear electric motor (such as, for example, a magnet track, stator segments, etc.) and linear position encoder (such as, for example, a scale for an optical, magnetic, inductive or capacitive position encoder read-head). The chamber sections 241 may include connecting and sealing features 242 at the joints of the sections 241. The sealing features may also be used perhaps at other areas, such as the ends of the chamber. This allows one section 241 to be attached to the next section 241 with a seal therebetween around the entire interior open area; a type of square or rectangle in this example, such as seen by the shape in FIG. 23B. As an example, flanges with fasteners or clamps may be utilized for mechanical connection. Polished sealing surfaces, coated sealing surfaces, grooves for sealing elements and/or various sealing elements, such as O-rings, may be used to achieve proper sealing. These are merely some examples and should not be considered limiting.

Linear Vacuum Robot Control System Architecture

Figures 25, 25A:
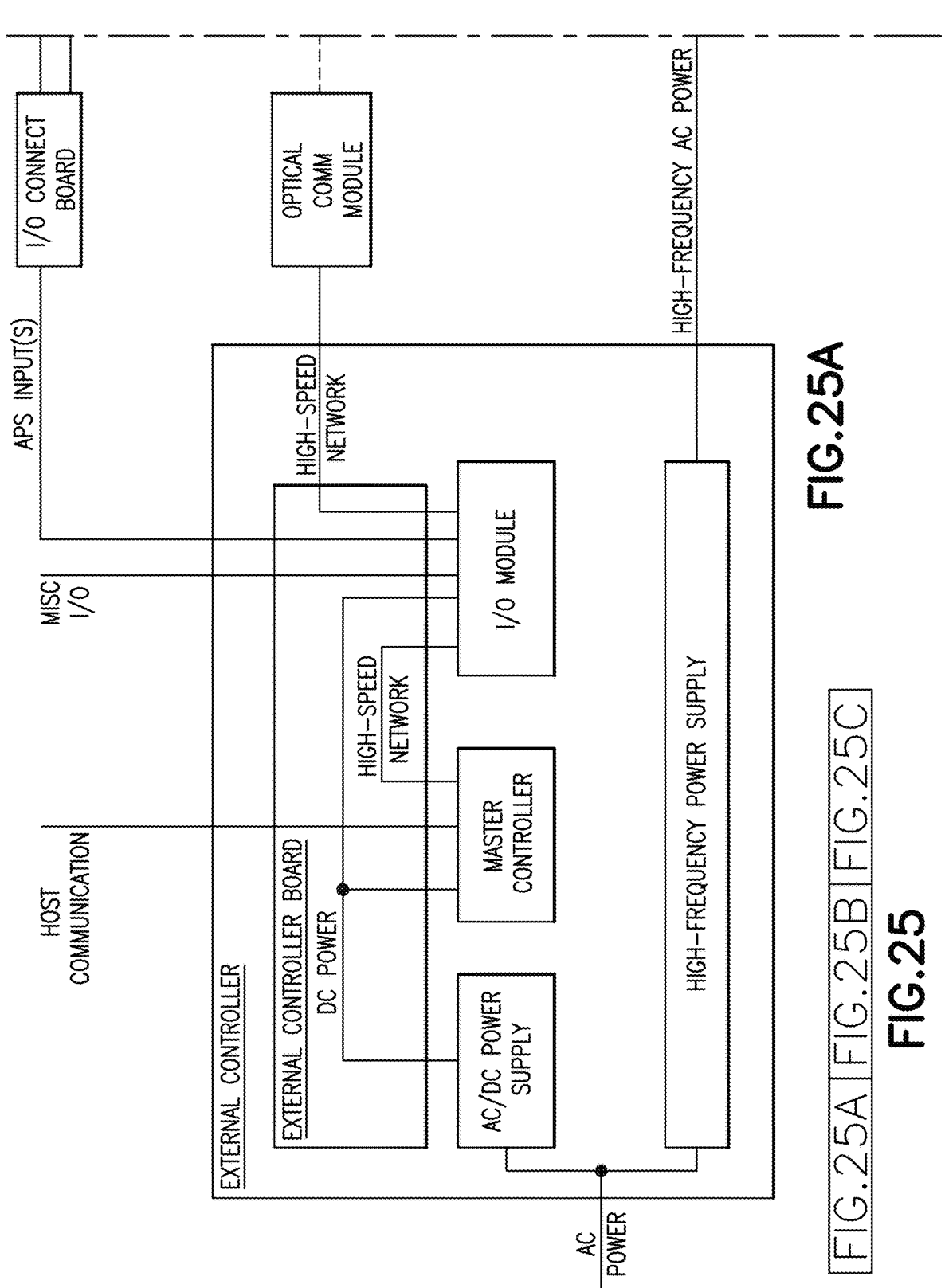
FIG. 25 (FIGS. 25A-25C collectively), FIG. 26 (FIGS. 26A-26C collectively), FIG. 27 (FIGS. 27A-27C collectively), FIG. 28 (FIGS. 28A-28C collectively), FIG. 29 (FIGS. 29A-29C collectively), FIG. 30 (FIGS. 30A-30C collectively) are diagrams illustrating various different example embodiments illustrating examples of linear robot control systems.
Figure 25B:
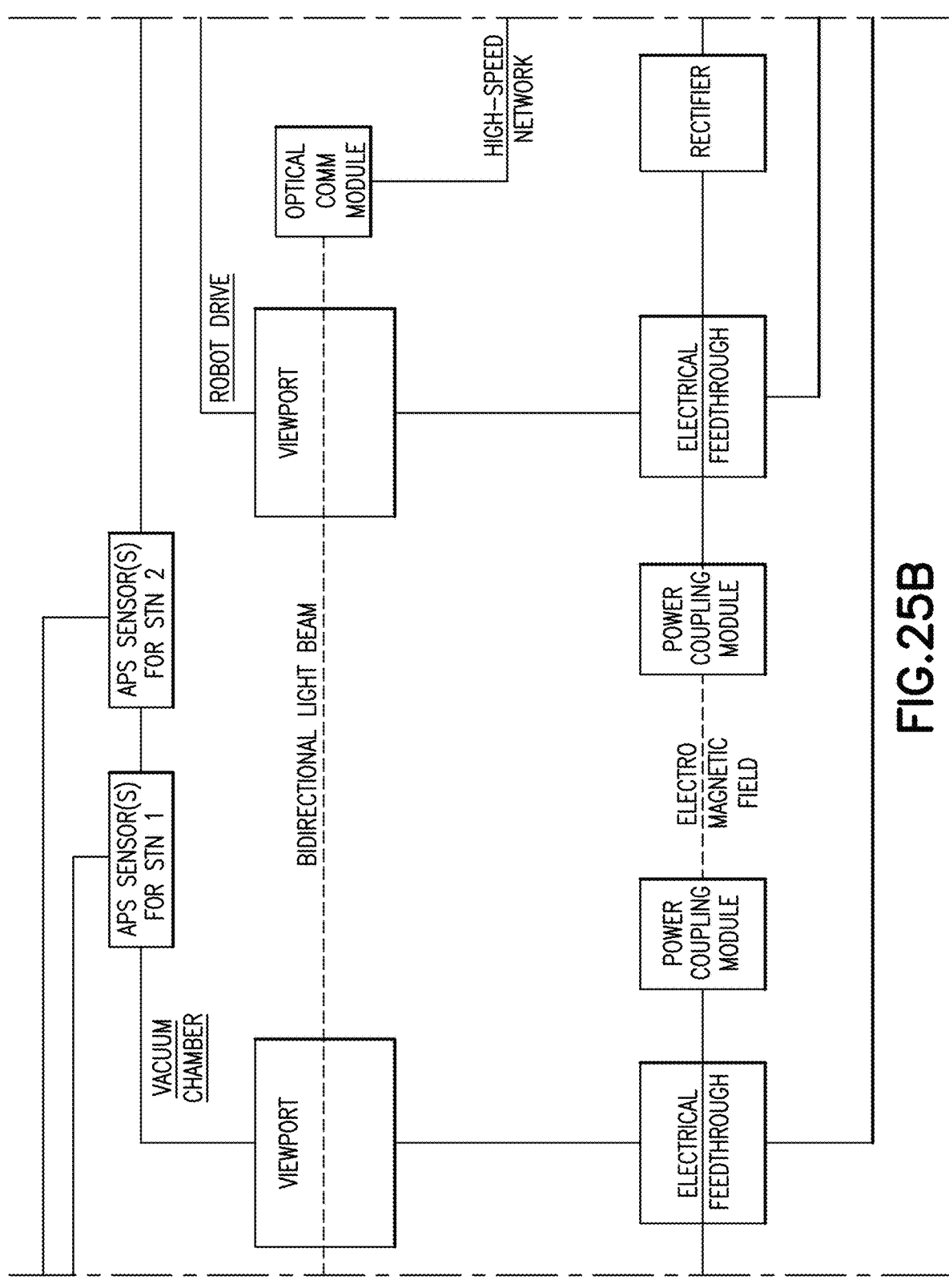
Figure 25C:
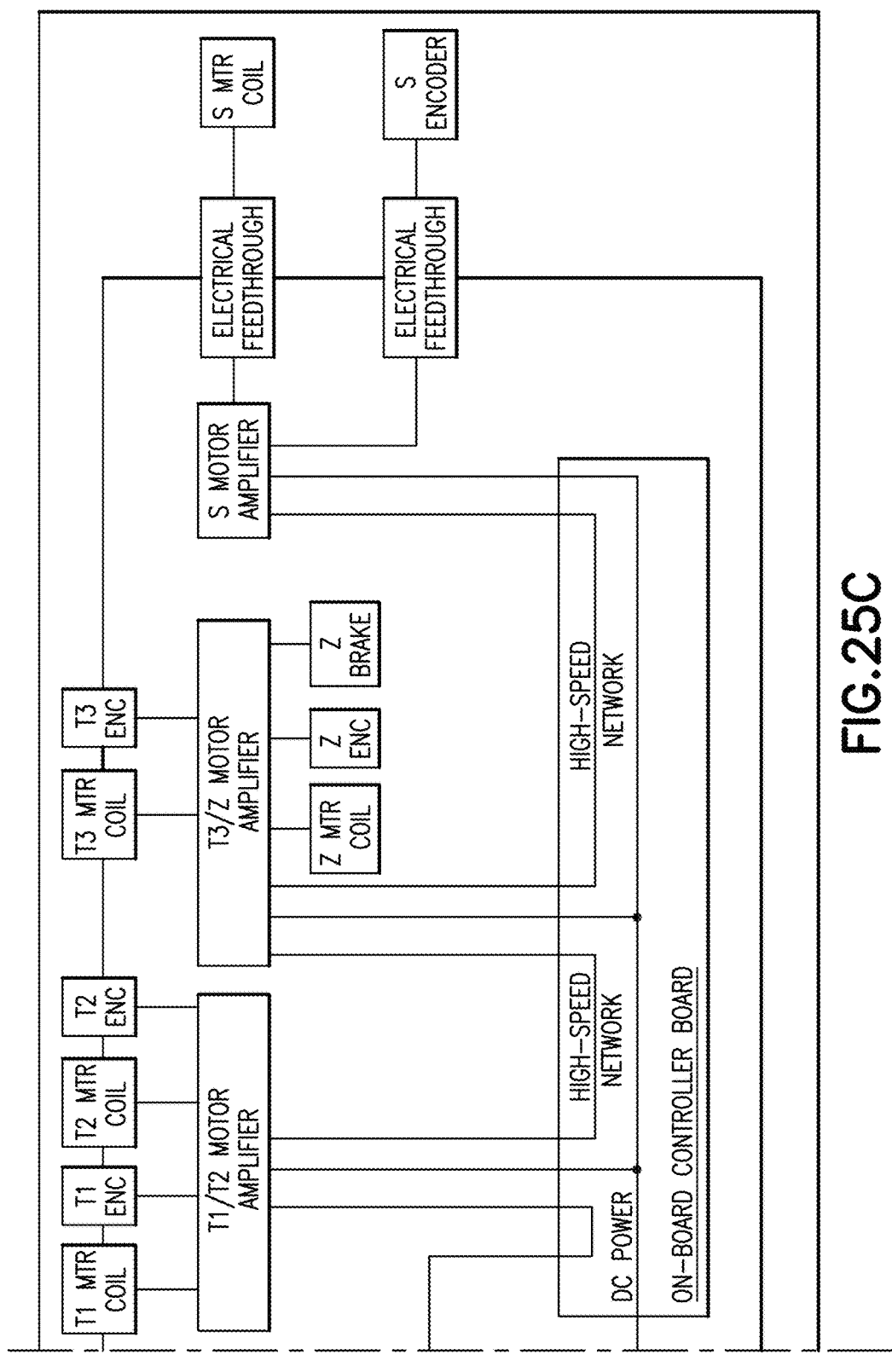

A block diagram of an example embodiment of the linear robot control system is provided in FIG. 25.

The master controller may perform the following functions: the user interface, communication with host controller (e.g., utilizing serial communication or Ethernet communication), configuration data management, high-level motion planning (i.e., sequencing of moves of the robot), trajectory generation (calculation of motion profiles for each move for each axis of motion), position control for all axes of motion and APS (adaptive placement system). One example of an adaptive placement system is described in U.S. Pat. No. 10,058,996 which is hereby incorporated by reference in its entirety.

The master controller may receive from the host controller various commands, including configuration, request and action commands, e.g., commands to perform a pick or place operation, and it may report back to the host controller completion of the commands and other information.

The master controller may receive over the high-speed network positions of all axes of motion (periodically from the motor amplifiers), status of digital and analog inputs (from the I/O module and, if applicable, from the motor amplifiers) and timing of digital input changes (from the I/O module and, if applicable, from the motor amplifiers). The master controller may send over the high-speed network commanded currents for each axis of motion (periodically to the motor amplifiers) and information to set digital and analog outputs (to the I/O module and, if applicable, to the motor amplifiers). Whether a rail based linear system or a maglev linear systems, the control system may comprise use of an optical communications link or other wireless communications link. For example, as shown in FIG. 25 the system may comprise two optical communications modules with respective viewports in the vacuum chamber wall and the robot drive wall. Thus, an optical communication link may be provided between the external controller and the robot drive, which may include a closed loop control as noted above.

The I/O module may read digital and analog inputs (which may include inputs from APS sensors) and set digital and analog outputs. The I/O module may receive over the high-speed network information to set digital and analog outputs (from the master controller), and it may send over the high-speed network status of digital and analog inputs (to the master controller) and timing of digital input changes (also to the master controller).

Each of the motor amplifiers may perform the following functions: execution of motor commutation algorithm(s), execution of current control loops, reading digital and analog inputs, and setting digital and analog outputs. Each of the motor amplifiers may read periodically measured position(s) from the position encoder(s) and set output voltages for control of the motor(s). Each motor amplifier may receive from the master controller over the high-speed network commanded current(s) for the axis or axes of motion supported (periodically) and information to set digital and analog outputs. It may send to the master controller over the high-speed network the measured positions of the axis or axes of motion supported (periodically), status of digital and analog inputs and, if applicable, timing of digital input changes.

The high-speed network (e.g., EtherCAT) may facilitate communication between the master controller and the I/O module as well as the motor amplifiers. The outbound traffic (i.e., from the master controller to the I/O module and motor amplifiers) may include commanded currents for each axis of motion (sent periodically from the master controller to the motor amplifiers) and information to set digital and analog outputs (sent from the master controller to the I/O module and, if applicable, to the motor amplifiers). The inbound traffic (i.e., from the I/O module and motor amplifiers to the master controller) may include measured positions (from the motor amplifiers), status of digital and analog inputs (from the I/O module and, if applicable, from the motor amplifiers) and timing of digital input changes (from the I/O module and, if applicable, from the motor amplifiers).

If APS (adaptive placement system) functionality is required, APS sensor(s) may be routed directly or through an I/O connection board to one or more inputs of the I/O module. The purpose of the optional I/O connection board is to reduce the number of inputs routed to the I/O module.

Figures 26, 26A:
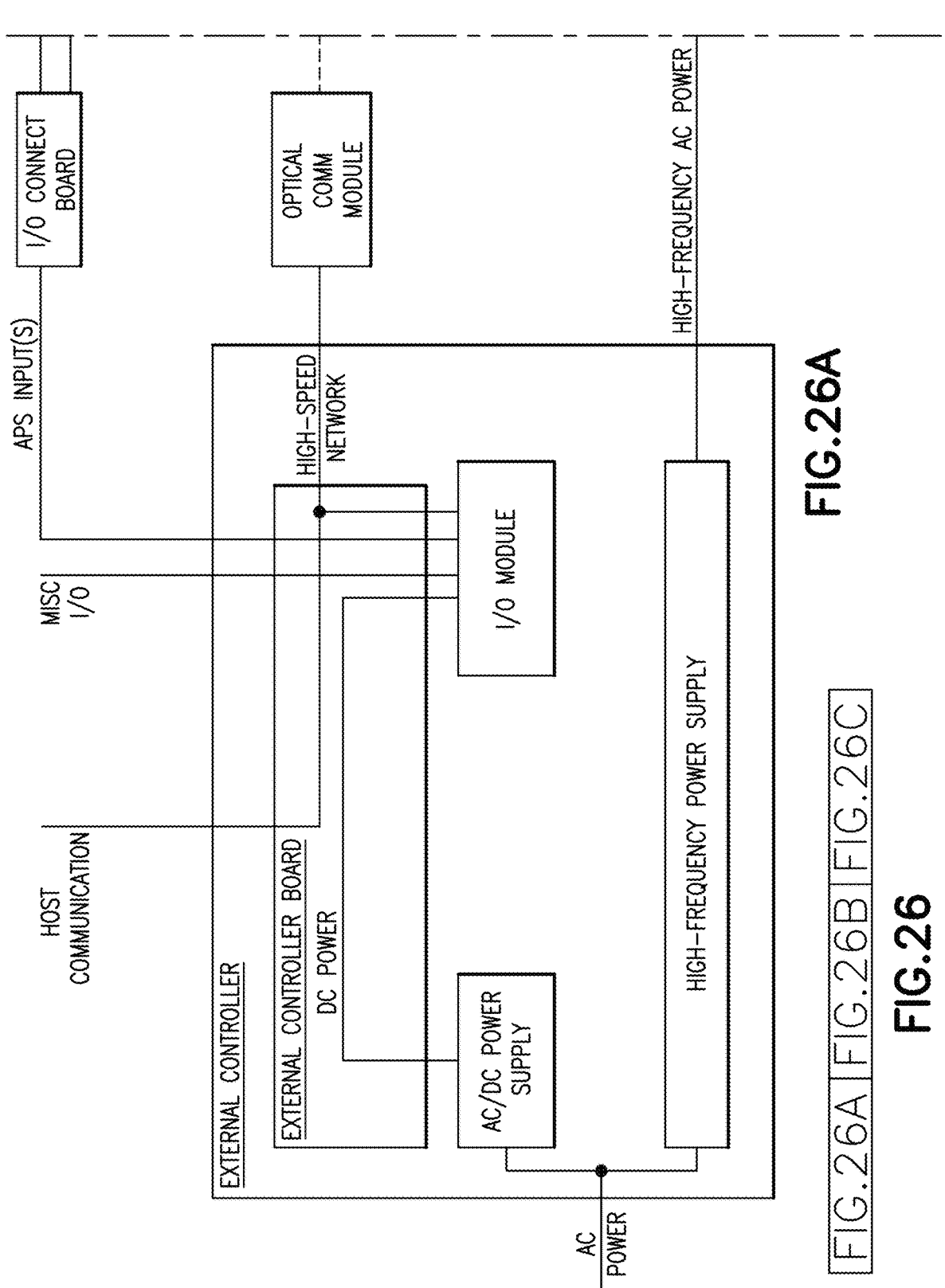
Figure 26B:
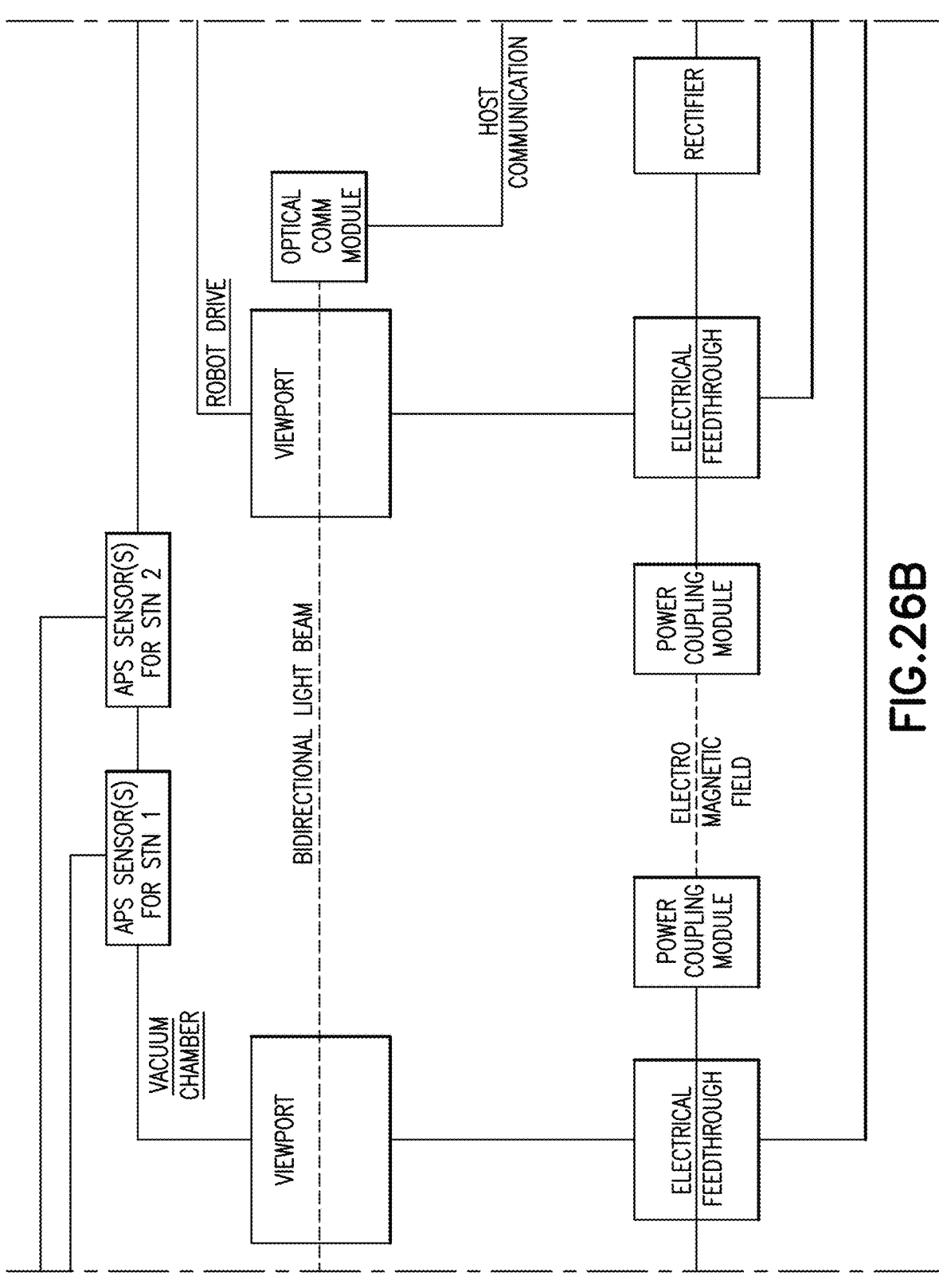
Figure 26C:
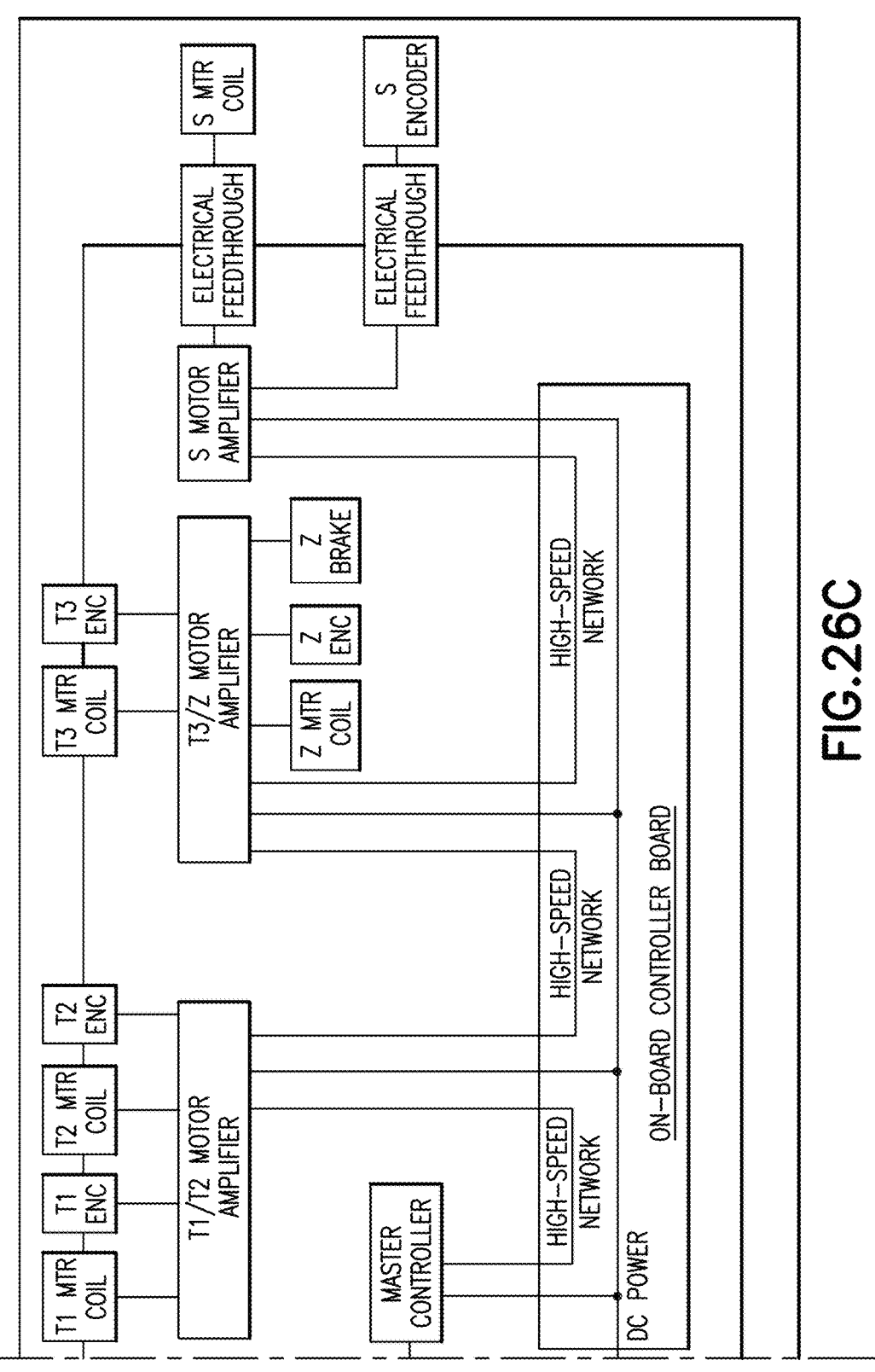

A block diagram of another example embodiment of the linear robot control system is provided in FIG. 26. In this example embodiment, the master controller may be located in the robot drive as opposed to being part of the external controller.

In the example embodiment of FIG. 26, the master controller may communicate with the motor amplifiers over the high-speed network substantially the same way as in the previous embodiment. However, another means of communication may be used for communication between the master controller and the I/O module. As an example, a separate communication network (e.g., Ethernet) may be used. The same communication network may also be utilized for communication with the host controller, as depicted diagrammatically in FIG. 26, in which case a network router may be conveniently incorporated into the external controller board. Alternatively, a separate means of communication may be used for communication between the host controller and the master controller and for communication between the master controller and the I/O module. These two communication channels may take place over the same physical medium (e.g., serial communication over Ethernet) or use different physical media.

The communication between the master controller and the I/O module may allow for synchronization of the clocks running on the two devices or feature another mechanism to properly determine timing of digital input changes on the I/O module for APS calculation purposes (for instance, an offset between the two clocks may be identified periodically and applied when a digital input change occurs).

Figures 27, 27A:
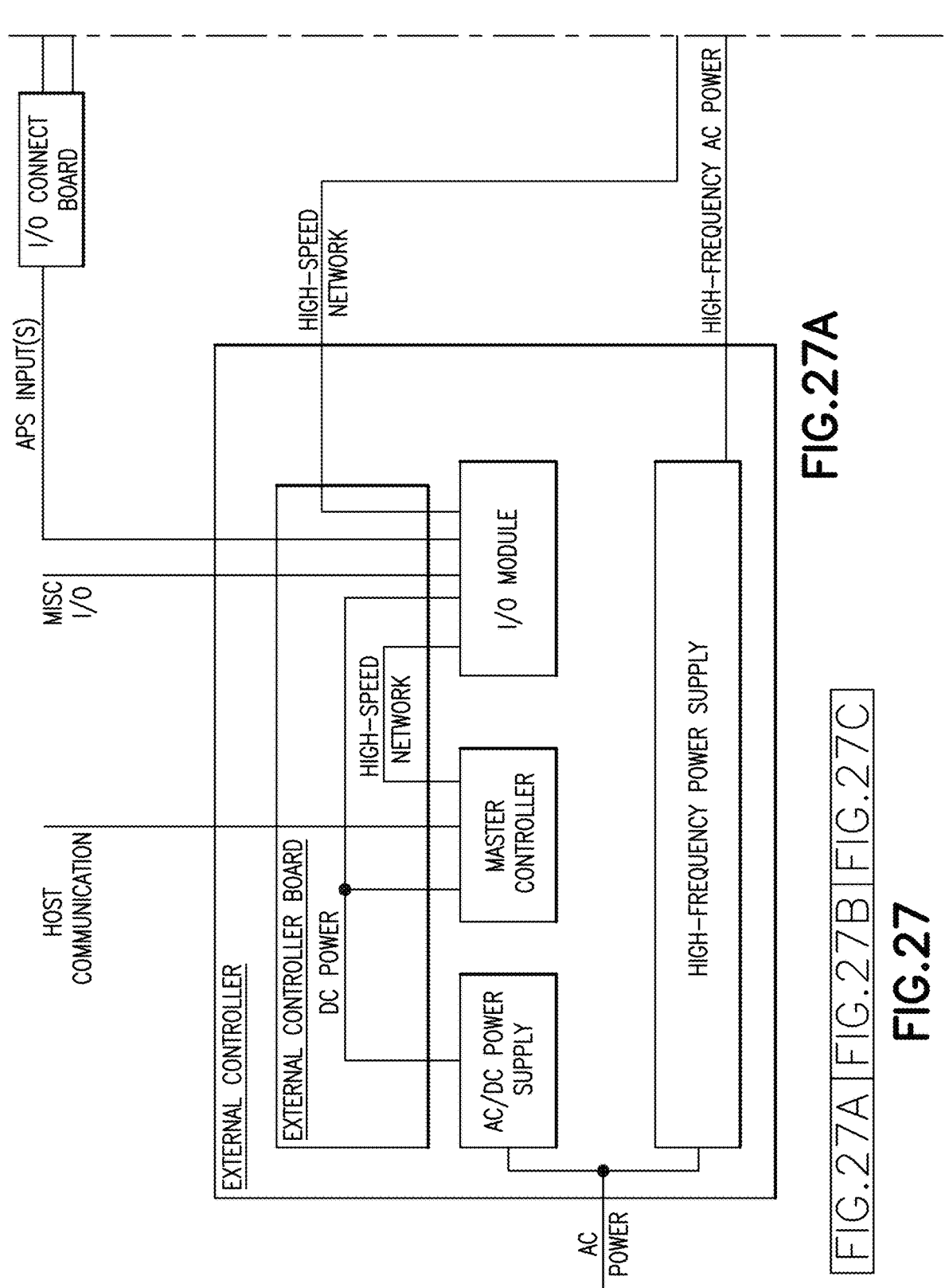
Figure 27B:
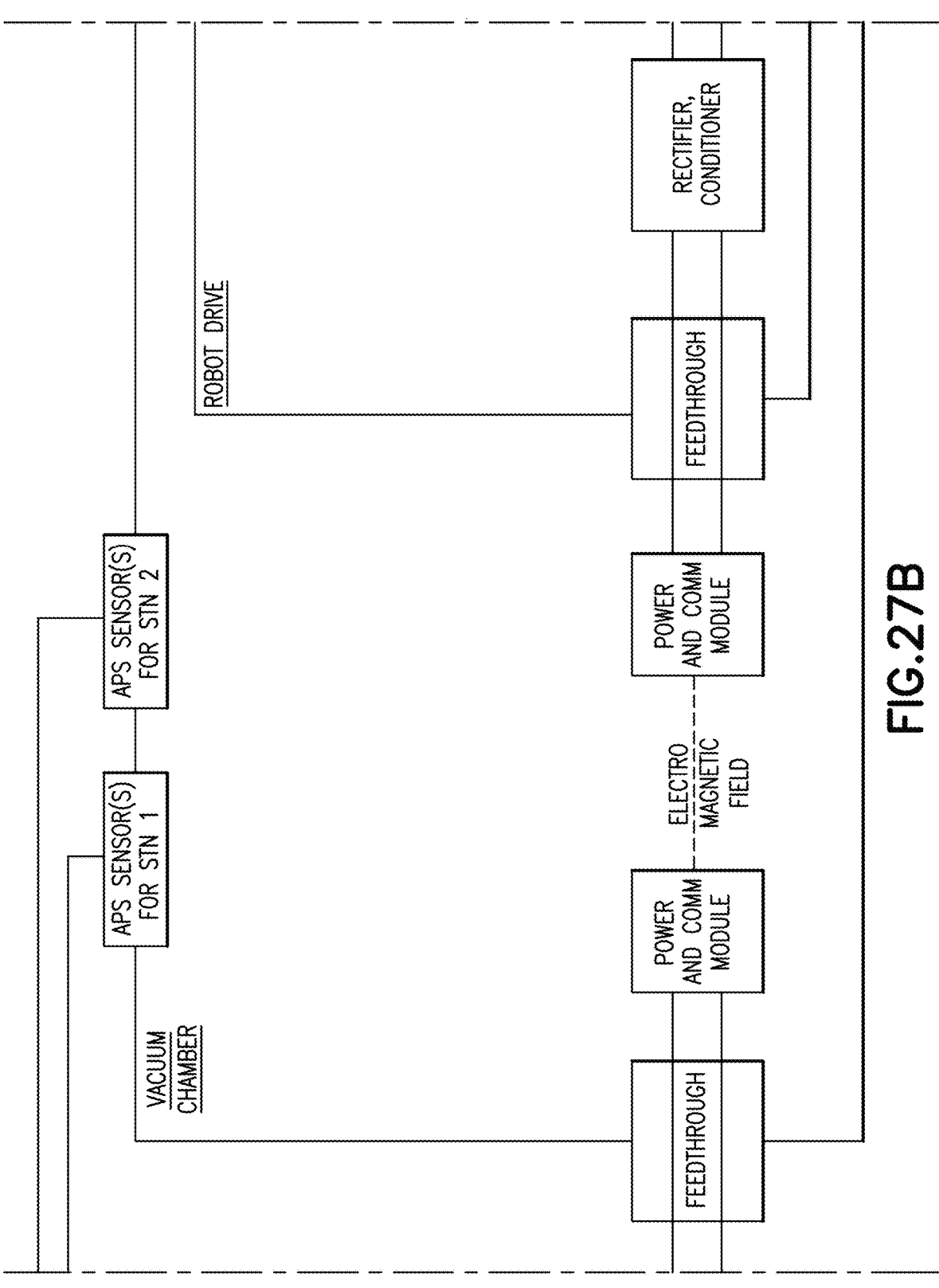
Figure 27C:
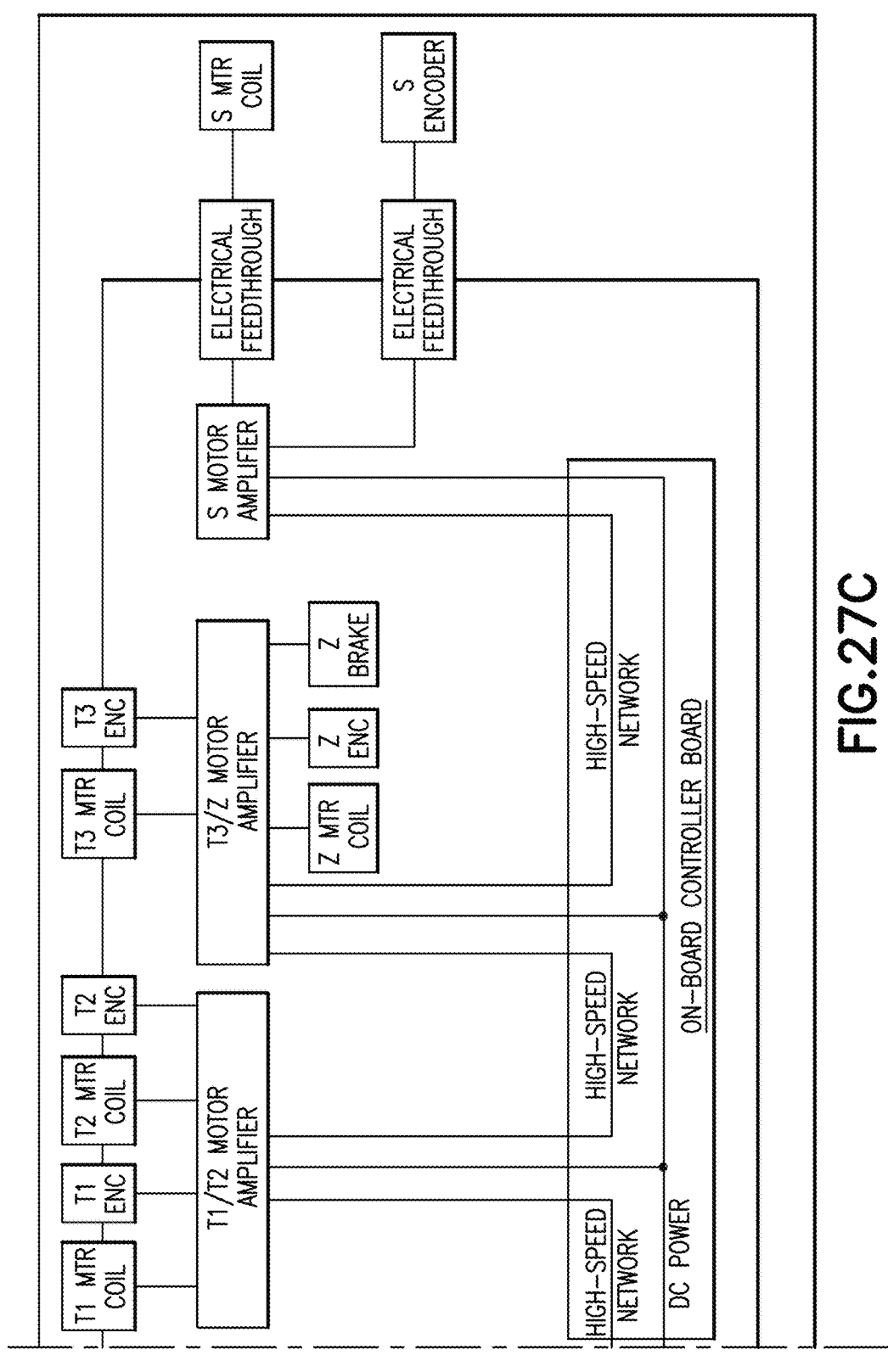
Figures 28, 28A:
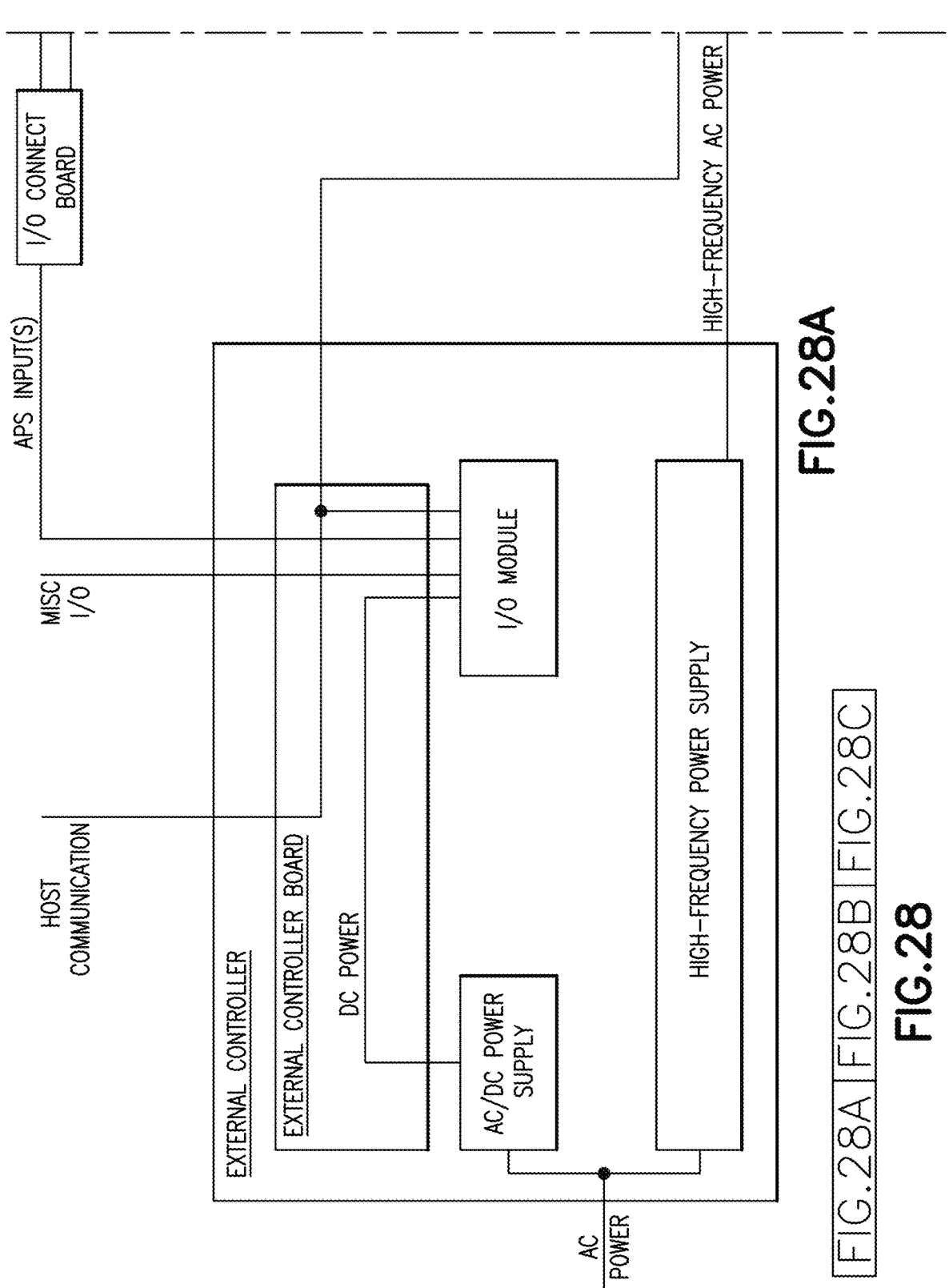
Figure 28B:
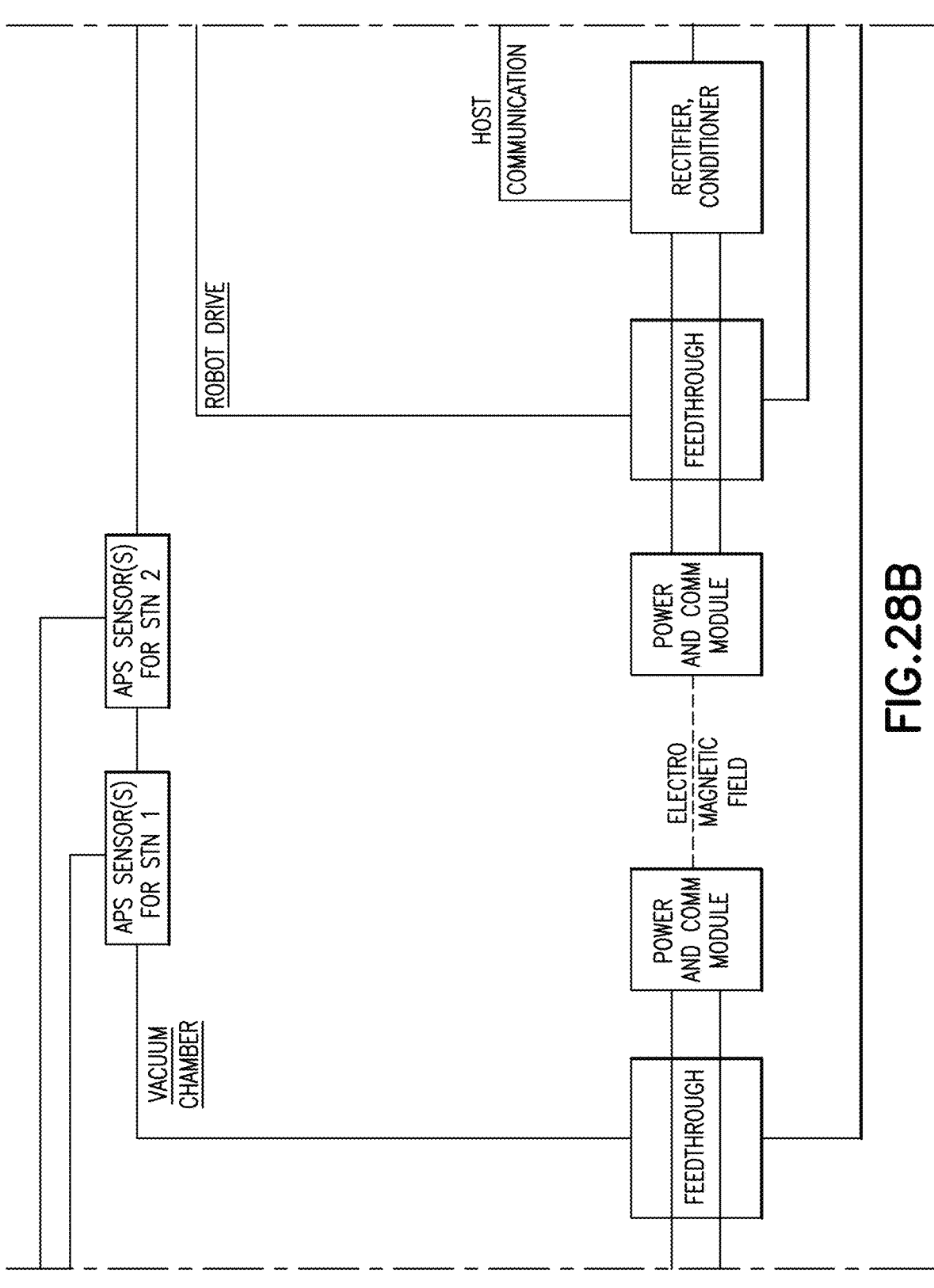
Figure 28C:
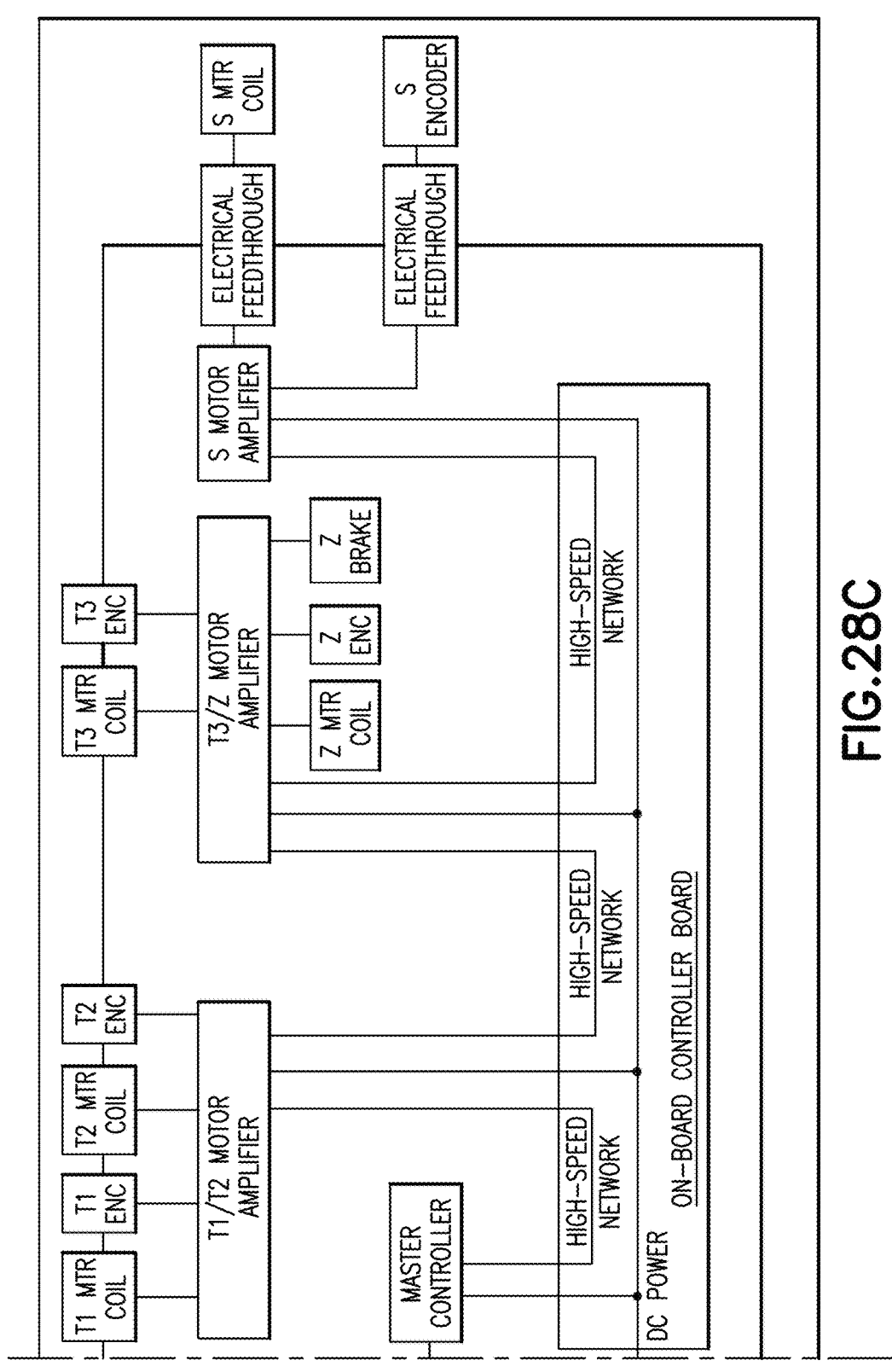

In yet another example embodiment, the high-speed communication via bidirectional light beam may be routed through the power coupling. The power coupling may employ the same set of coils as for power transmission or and additional set of coils to transmit data. An example embodiment equivalent to FIG. 25 is depicted diagrammatically in FIG. 27, and an example embodiment equivalent to FIG. 26 is shown diagrammatically in FIG. 28.

Figures 29, 29A:
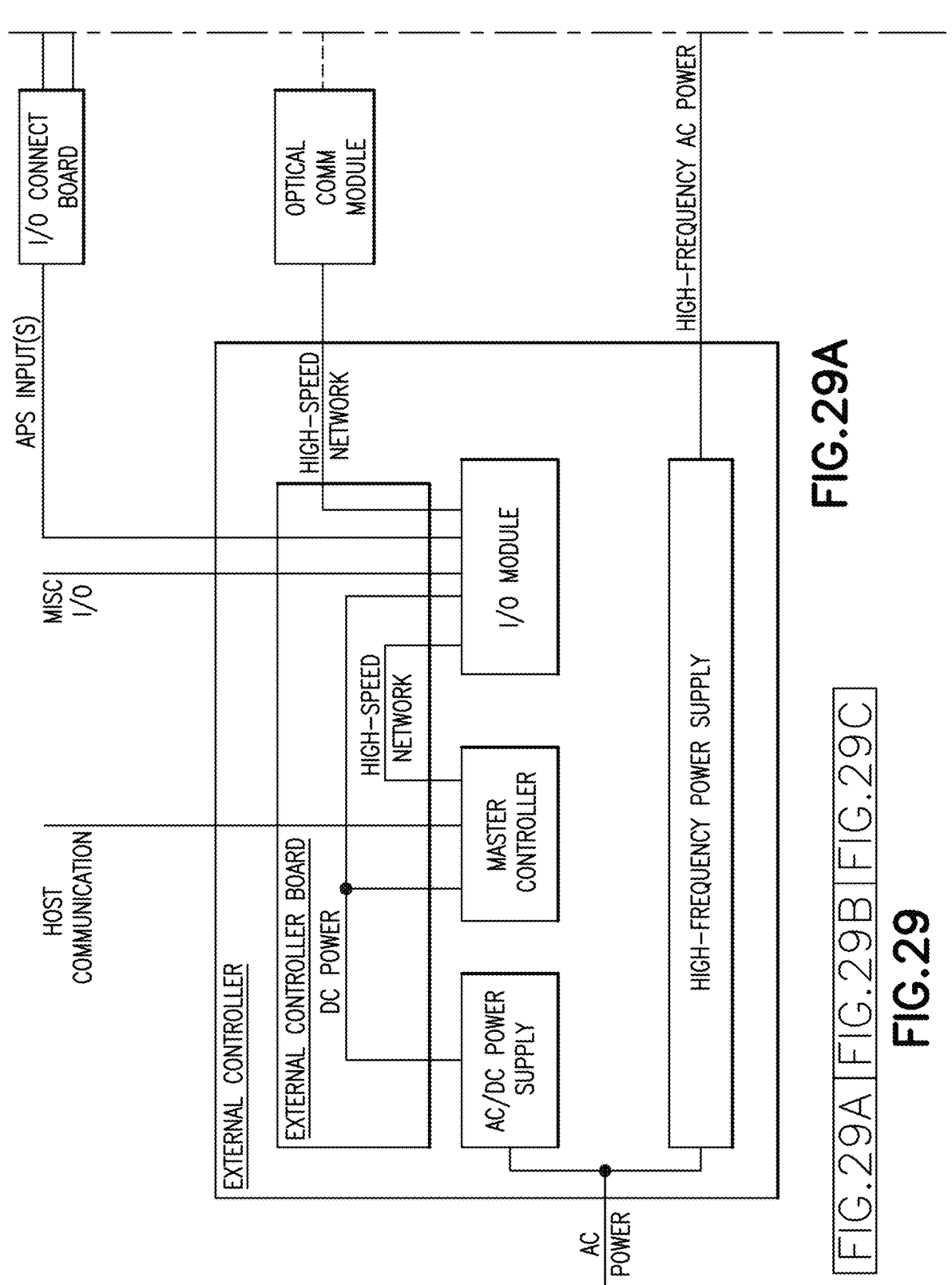
Figure 29B:
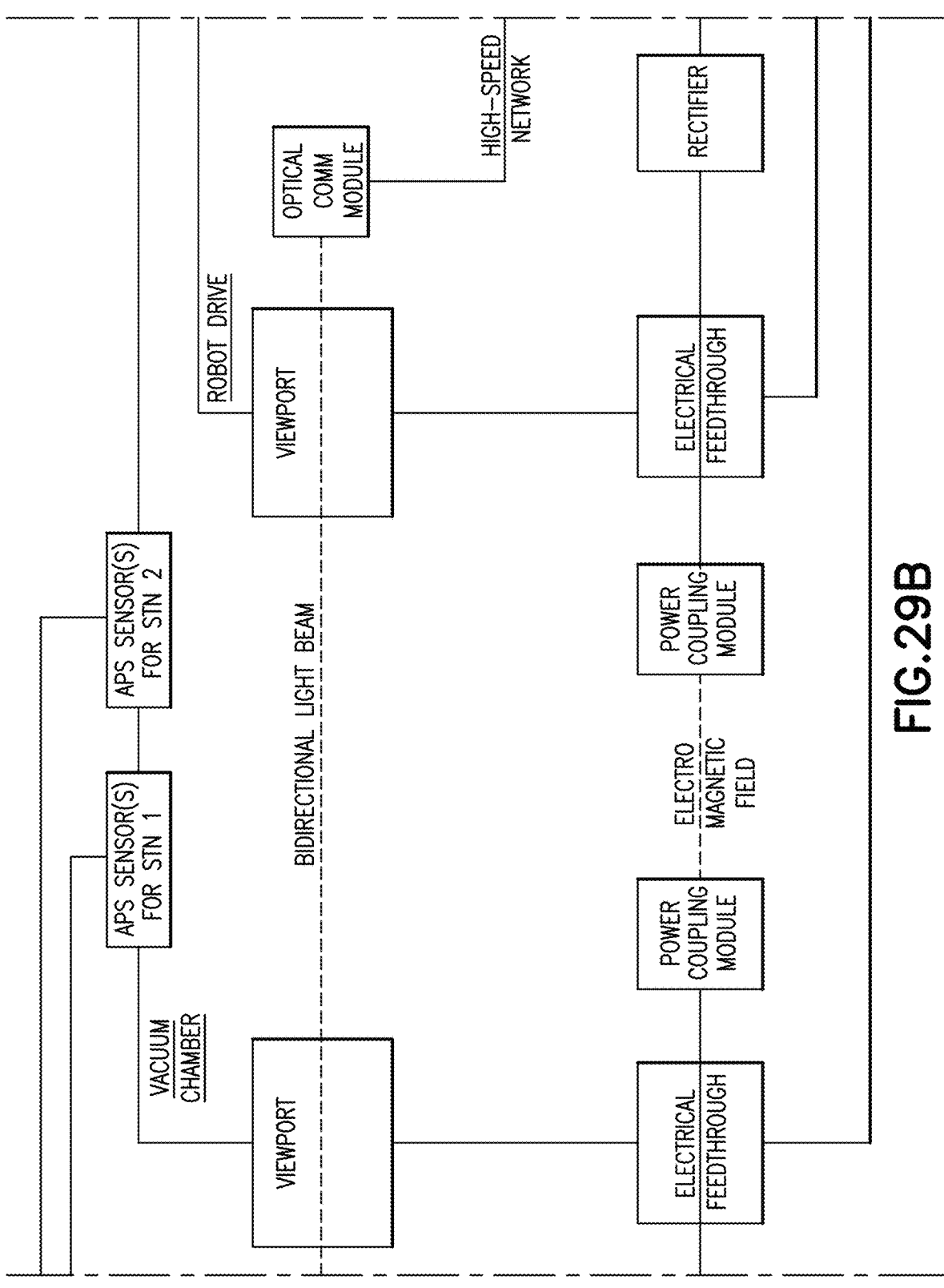
Figure 29C:
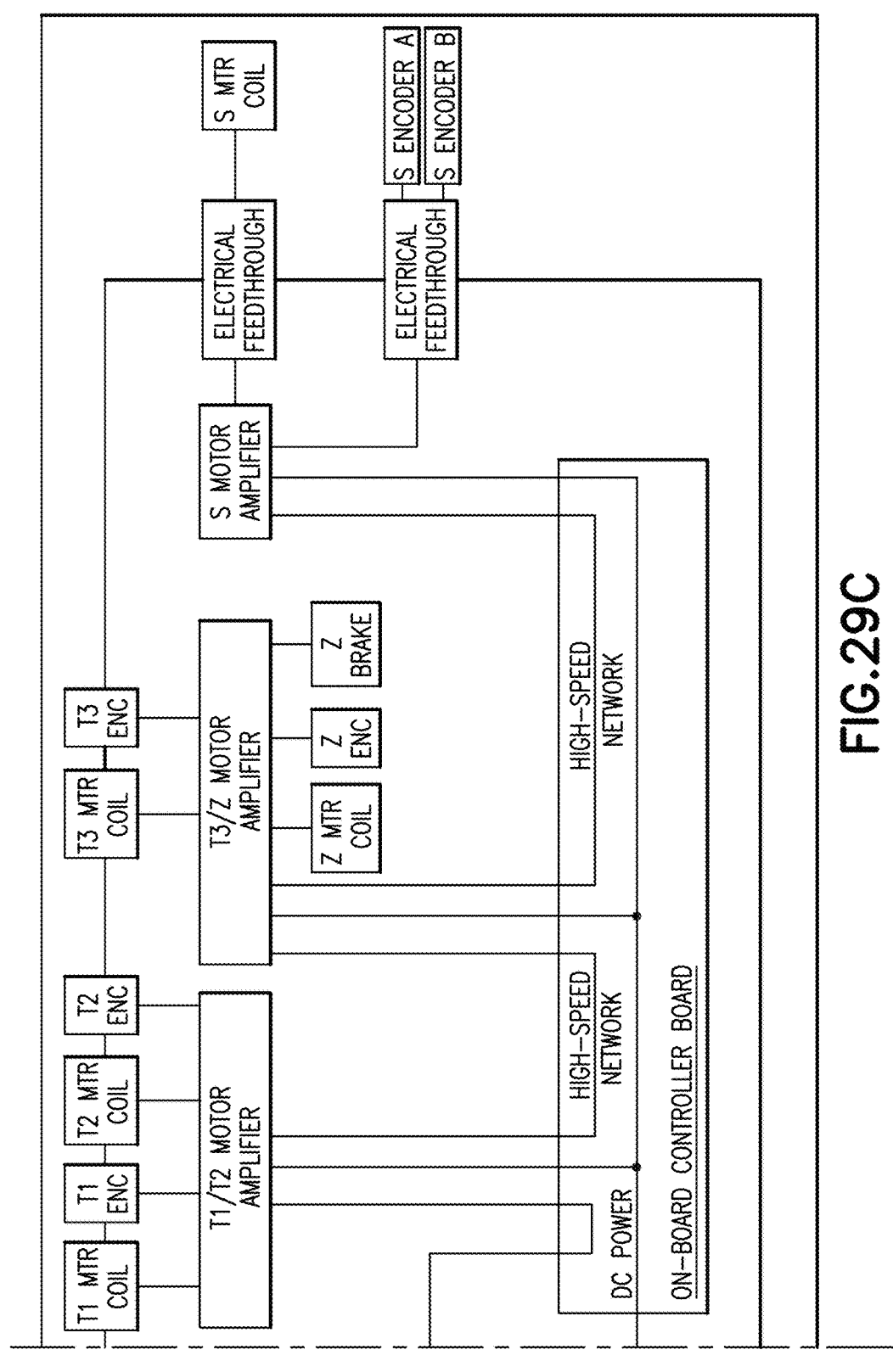
Figures 30, 30A:
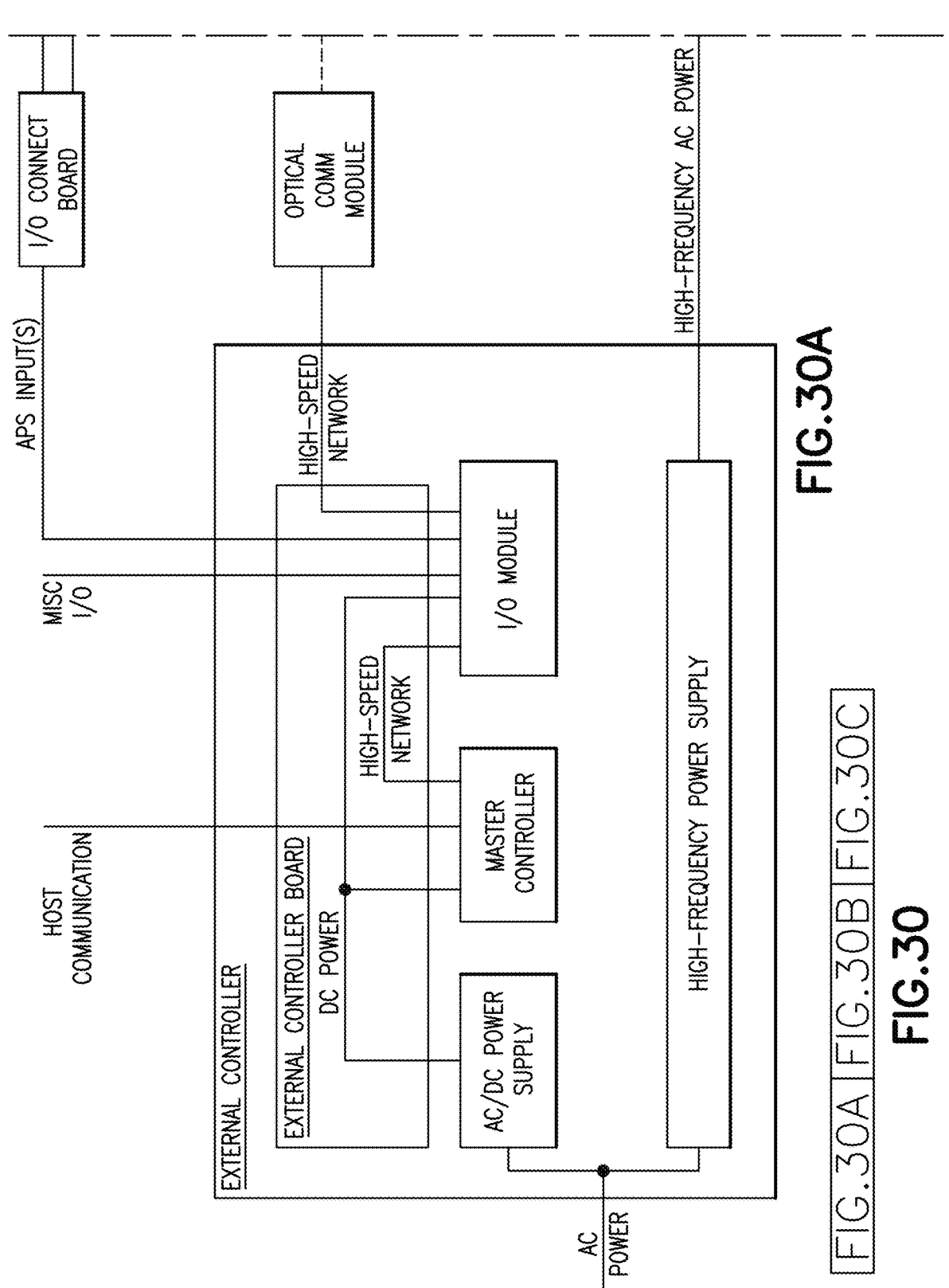
Figure 30B:
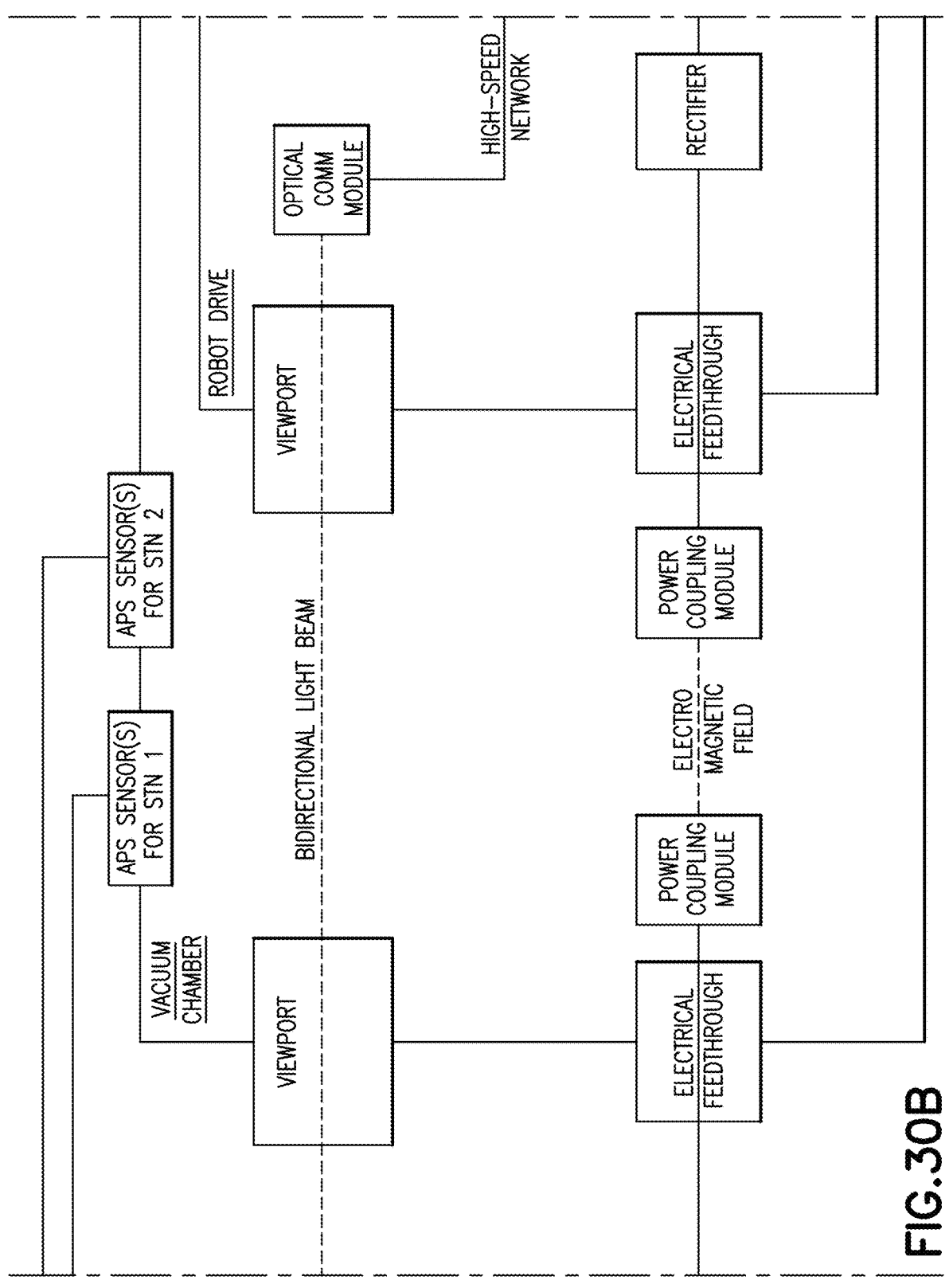
Figure 30C:
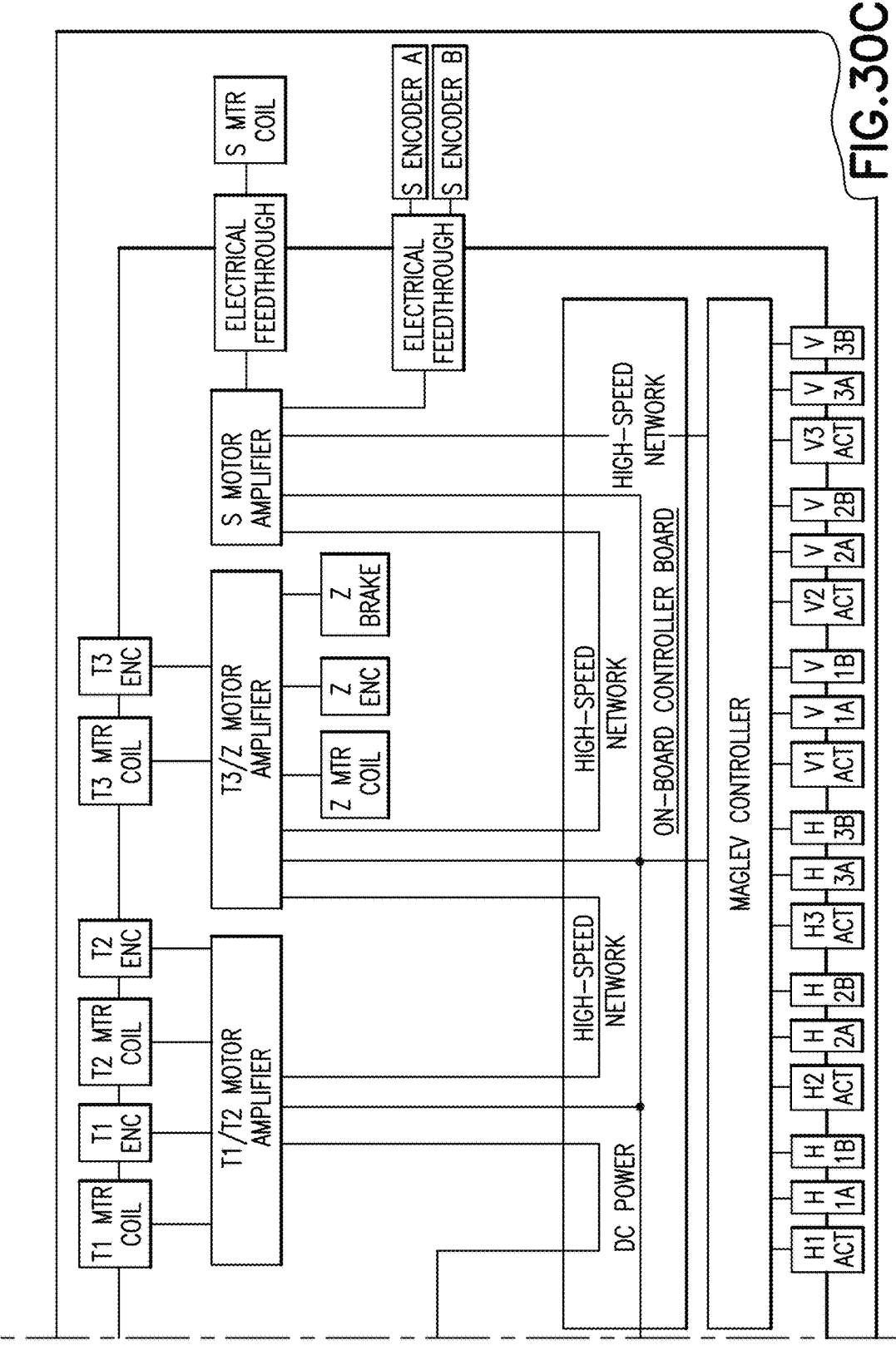

Block diagrams of additional example embodiments of the linear robot control system that include control of a magnetic support system (maglev) are shown in FIGS. 29-30.

The maglev controller may perform position control of the robot drive (e.g., control the five degrees of freedom associated with the lateral position, vertical position, pitch angle, roll angle and yaw angle of the robot drive) and run current control loops for each of the actuators of the magnetic support system. In the process, the maglev controller may periodically read measured positions from the position sensors of the magnetic support system (e.g., two horizontal sensors and three vertical sensors) and set output voltages for the force actuators of the magnetic support system (e.g., two horizontal actuator pairs and three vertical actuator pairs). The maglev controller may receive from the master controller over the high-speed network various commands, including commands to lift off, to maintain a given position (which may be conveniently expressed in the form of gaps between the robot drive and the guides of the magnetic support system) and to land the robot drive. Alternatively, the maglev controller may receive from the master controller a stream of commanded positions (e.g., in the form of data frames sent periodically).

As another alternative, the master control may execute position control of the robot drive via the magnetic support system. In the process, the master controller may receive periodically from the maglev controller over the high-speed network measured positions from the sensors of the magnetic support system and send periodically to the maglev controller over the high-speed network commanded currents for each force actuator of the magnetic support system. In this arrangement, the maglev controller may still run current control loops for each of the actuators of the magnetic support system.

In order to support a modular design of the vacuum chamber (i.e., a vacuum chamber composed of multiple sections), an additional encoder read-head for the linear actuation system and/or additional position sensors for the magnetic support system may be utilized to enable smooth transition between individual sections of the vacuum chamber. This is diagrammatically illustrated in FIGS. 29 and 30.

All of the above embodiments may include additional feature that have been left from the diagrams for the sake of simplicity. For example, the external controller may include support for a teach pendant, e-stop, interlocks, safety circuitry (including solid-state components and electromechanical contactor(s)) and energy storage (e.g., batteries and/or capacitors). Similarly, the on-board controller may feature safety circuitry (including solid-state components and electromechanical contactor(s)) back emf regeneration system and power storage (e.g., batteries and/or capacitors).

Although the above example embodiments described with respect to FIGS. 25-28 show three rotary axes of motion (T1, T2 and T3), any number of rotary axes or no rotary axis may be used. Similarly, although the above example embodiments of FIGS. 25-28 show one z-axis, any number of z-axes or no z-axis may be employed.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A transport apparatus, comprising:

a first base plate having a first position track, where the first base plate is configured to have at least one first linear drive component and/or at least one first power coupling component connected to a top side of the first base plate, where the first base plate is configured to be located inside a vacuum chamber;

a second base plate having a second position track, where the second base plate is configured to have at least one second linear drive component and/or at least one second power coupling component connected to a top side of the second base plate, where the second base plate is configured to be located outside the vacuum chamber, where an end of the second base plate is aligned with an end of the first base plate and an end of the second position track is aligned with an end of the first position track to form a gap between the second position track and the first position track;

a plurality of transport guides on the top side of the first base plate and on the top side of the second base plate; and a robot drive configured to move on the plurality of transport guides along the first position track and the second position track, the robot drive comprising a first position sensor configured to sense the first position track and the second position track and a second position sensor configured to sense the first position track and the second position track, the first position sensor being spaced from the second position sensor such that when the first position sensor engages the gap, the second position sensor senses a position of the robot drive on one of the first position track or the second position track and when the second position sensor engages the gap, the first position sensor senses the position of the robot drive on one of the first position track or the second position track, where a position of the robot drive on the first position track or the second position track is used to determine an operation of the robot drive;

where an end of the first base plate comprises at least one alignment feature configured to align the end of the first base plate to an end of the second base plate, and where the first base plate comprises a seal between the inside of the vacuum chamber and the outside of the vacuum chamber.

2. The transport apparatus as in claim 1, where the first position sensor is spaced from the second position sensor relative to a length of the first position track or a length of the second position track.

3. The transport apparatus as in claim 1, further comprising a controller on the robot drive, the controller being configured to switch between activation of the first position sensor and the second position sensor based on a location of the gap.

4. The transport apparatus as in claim 3, where an algorithm is implemented to use data from the first position sensor and the second position sensor to obtain a gradual transition of data during the switch between the activation of the first position sensor and the second position sensor.

5. The transport apparatus as in claim 3, where an algorithm is implemented to combine data from the first position sensor and the second position sensor when both the first position sensor and the second position sensor are activated.

6. The transport apparatus as in claim 1, where the at least one alignment feature is configured to align the plurality of transport guides on the first base plate with the plurality of transport guides on the second base plate.

7. The transport apparatus as in claim 1, where the at least one alignment feature comprises at least one projection extending from the end of the first base plate and at least one recess extending into the first end of the first base plate.

8. The transport apparatus as in claim 1, where the end of the first base plate comprises at least one mechanical connection feature projecting from the end of the first base plate, where the at least one mechanical connection feature is configured to be mechanically attached to the second base plate with at least one fastener.

9. The transport apparatus as in claim 1, where the first base plate is configured to be mechanically attached directly to the vacuum chamber at a bottom side of the vacuum chamber.

10. The transport apparatus as in claim 1, further comprising the vacuum chamber, where the vacuum chamber comprises a plurality of main sections configured to be attached to one another in an end-to-end configuration to form an elongate shaped frame having the first base plate connected thereto, where the main sections comprise opposite lateral side walls and a bottom wall portion, and at least one lid section configured to be removably connected to top sides of the opposite lateral side walls.

11. The transport apparatus as in claim 1, further comprising the at least one linear drive component connected to the top side of the first base plate, where the at least one linear drive component is configured to provide a magnetic field to move the robot drive along the plurality of transport guides.

12. The transport apparatus as in claim 1, further comprising the power coupling component, where the power coupling component is configured to transfer power to another power coupling component on the robot drive, where the transfer of power is with induction.

* * * * *